United States Patent
Jeon et al.

(10) Patent No.: US 11,600,682 B2
(45) Date of Patent: Mar. 7, 2023

(54) DISPLAY DEVICE AND METHOD OF FABRICATING THE SAME

(71) Applicant: Samsung Display Co., Ltd., Yongin-si (KR)

(72) Inventors: Kyung Jin Jeon, Incheon (KR); So Young Koo, Yongin-si (KR); Eok Su Kim, Seoul (KR); Hyung Jun Kim, Seoul (KR); Jun Hyung Lim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 317 days.

(21) Appl. No.: 17/074,323

(22) Filed: Oct. 19, 2020

(65) Prior Publication Data

US 2021/0249499 A1   Aug. 12, 2021

(30) Foreign Application Priority Data

Feb. 12, 2020   (KR) .......................... 10-2020-0016888

(51) Int. Cl.
  *H01L 27/32*   (2006.01)
  *H01L 27/12*   (2006.01)
  *H01L 51/56*   (2006.01)

(52) U.S. Cl.
  CPC ...... *H01L 27/3276* (2013.01); *H01L 27/3248* (2013.01); *H01L 27/3272* (2013.01);
  (Continued)

(58) Field of Classification Search
  CPC ............. H01L 27/3276; H01L 27/3248; H01L 27/3272; H01L 27/3258; H01L 2227/323
  See application file for complete search history.

(56) References Cited

U.S. PATENT DOCUMENTS

2016/0099300 A1*  4/2016  Lee ..................... H01L 27/3265
                                                            257/40
2017/0133413 A1*  5/2017  Park ................... G02F 1/133512
                            (Continued)

FOREIGN PATENT DOCUMENTS

KR   10-2016 0056390 A   5/2016
KR   10-2017-0078394 A   7/2017
                (Continued)

*Primary Examiner* — Mohsen Ahmadi
(74) *Attorney, Agent, or Firm* — Lewis Roca Rothgerber Christie LLP

(57) ABSTRACT

A display device and a method of driving a display device are provided. A display device includes a substrate, a first conductive layer on the substrate and including a lower light blocking pattern, a buffer layer on the first conductive layer, a semiconductor layer including a semiconductor pattern on the buffer layer, a gate insulating layer on the semiconductor pattern, a second conductive layer including a gate electrode on the gate insulating layer, a planarization layer on the second conductive layer, and a third conductive layer on the planarization layer and including a first conductive pattern electrically coupling the lower light blocking pattern to the semiconductor pattern, wherein the first conductive pattern is coupled to the lower light blocking pattern through a first contact hole passing through the planarization layer and the buffer layer, and coupled to the semiconductor pattern through a second contact hole passing through the planarization layer.

17 Claims, 25 Drawing Sheets

(52) U.S. Cl.
CPC ...... *H01L 27/3258* (2013.01); *H01L 27/3265* (2013.01); *H01L 2227/323* (2013.01)

(56) References Cited

U.S. PATENT DOCUMENTS

| | | | | |
|---|---|---|---|---|
| 2018/0122837 | A1* | 5/2018 | Kang | H01L 27/124 |
| 2019/0131369 | A1* | 5/2019 | Choi | H01L 27/3276 |
| 2019/0181207 | A1* | 6/2019 | Kim | H01L 27/1225 |
| 2020/0052053 | A1* | 2/2020 | Song | H01L 27/3246 |
| 2020/0119120 | A1* | 4/2020 | Feng | H01L 27/3265 |
| 2020/0135772 | A1* | 4/2020 | Lee | G09G 3/3233 |
| 2020/0212077 | A1* | 7/2020 | Jang | H01L 27/1255 |
| 2021/0036028 | A1* | 2/2021 | Kim | H01L 27/1237 |

FOREIGN PATENT DOCUMENTS

| | | |
|---|---|---|
| KR | 10-2018-0025718 A | 3/2018 |
| KR | 10-2019-0048390 A | 5/2019 |
| KR | 10-1990554 B1 | 6/2019 |

\* cited by examiner

110: 111, 112, 113, 114, 115

DISPLAY DEVICE AND METHOD OF FABRICATING THE SAME

CROSS-REFERENCE TO RELATED APPLICATION

This application claims priority to and the benefit of Korean Patent Application No. 10-2020-0016888 filed on Feb. 12, 2020 in the Korean Intellectual Property Office, the entire contents of which are hereby incorporated by reference.

BACKGROUND

1. Field

Embodiments of the present disclosure relate to a display device and a method of fabricating the same.

2. Description of the Related Art

An electronic device such as a television, a smart phone, a tablet PC, a digital camera, a laptop computer and a navigation system, which provides an image to a user, includes a display device for displaying an image.

The display device may include a plurality of pixels and a pixel circuit for driving each pixel. Each pixel circuit is formed using a thin film transistor and a wiring formed on an insulating substrate.

The display device as described above may be formed through a plurality of mask processes. The mask processes may be usefully used to pattern wirings, insulating films and the like, but process efficiency may decrease as the mask processes are added (e.g., added one by one).

SUMMARY

Aspects of embodiments of the present disclosure provide a display device having a reduced number of masks used in a fabricating process.

Aspects of embodiments of the present disclosure also provide a method of fabricating a display device having a reduced number of masks used in a fabricating process.

However, aspects of embodiments of the present disclosure are not restricted to those set forth herein. The above and other aspects of embodiments of the present disclosure will become more apparent to one of ordinary skill in the art to which the present disclosure pertains by referencing the detailed description of the present disclosure given below.

An embodiment of a display device includes a substrate, a first conductive layer on the substrate and including a lower light blocking pattern, a buffer layer on the first conductive layer, a semiconductor layer including a semiconductor pattern on the buffer layer, a gate insulating layer on the semiconductor pattern, a second conductive layer including a gate electrode on the gate insulating layer, a planarization layer on the second conductive layer, and a second conductive layer on the planarization layer, the second conductive layer including a first conductive pattern electrically coupling the lower light blocking pattern to the semiconductor pattern, wherein the first conductive pattern is coupled to the lower light blocking pattern through a first contact hole passing through the planarization layer and the buffer layer, and coupled to the semiconductor pattern through a second contact hole passing through the planarization layer.

An embodiment of a display device includes a substrate, a first conductive layer on the substrate and including a signal line, a buffer layer on the first conductive layer, a semiconductor layer including a semiconductor pattern on the buffer layer, a gate insulating layer on the semiconductor layer, a second conductive layer including a gate electrode on the gate insulating layer, a planarization layer on the second conductive layer, and a third conductive layer on the planarization layer and including a conductive pattern electrically coupling the semiconductor pattern to the signal line, wherein the conductive pattern is coupled to the signal line through a first contact hole passing through the planarization layer and the buffer layer, and coupled to the semiconductor pattern through a second contact hole passing through the planarization layer.

An embodiment of a method of fabricating a display device, the method includes depositing a first conductive layer material, a buffer layer material and a semiconductor layer material entirely on a substrate, etching the first conductive layer material, the buffer layer material and the semiconductor layer material using a mask having a light blocking part and two or more light transmitting parts having different transmittances to pattern a first conductive layer including a lower light blocking pattern and a semiconductor layer including a buffer layer and a semiconductor pattern, forming a gate insulating layer on the semiconductor layer, forming a second conductive layer including a gate electrode on the gate insulating layer, forming a planarization layer on the second conductive layer, and forming a third conductive layer on the planarization layer, the third conductive layer including a first conductive pattern electrically coupling the lower light blocking pattern to the semiconductor pattern, wherein the first conductive pattern is coupled to the lower light blocking pattern through a first contact hole passing through the planarization layer and the buffer layer, and coupled to the semiconductor pattern through a second contact hole passing through the planarization layer.

According to a display device and a method of fabricating the display device according to an exemplary embodiment, the number of masks can be reduced, thereby reducing process cost and increasing process efficiency.

The effects of the present disclosure are not limited to the aforementioned effects, and various other effects are included in the present specification.

BRIEF DESCRIPTION OF THE DRAWINGS

The above and other aspects and features of embodiments of the present disclosure will become more apparent by describing in more detail exemplary embodiments thereof with reference to the attached drawings, in which.

DETAILED DESCRIPTION

The subject matter of the present disclosure will now be described more fully hereinafter with reference to the accompanying drawings, in which certain embodiments of the present disclosure are shown. The subject matter of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification. In the accompanying figures, the thicknesses of layers and regions may be exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from the scope of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

Hereinafter, exemplary embodiments of the present disclosure will be described in more detail with reference to the accompanying drawings.

Figure 1:
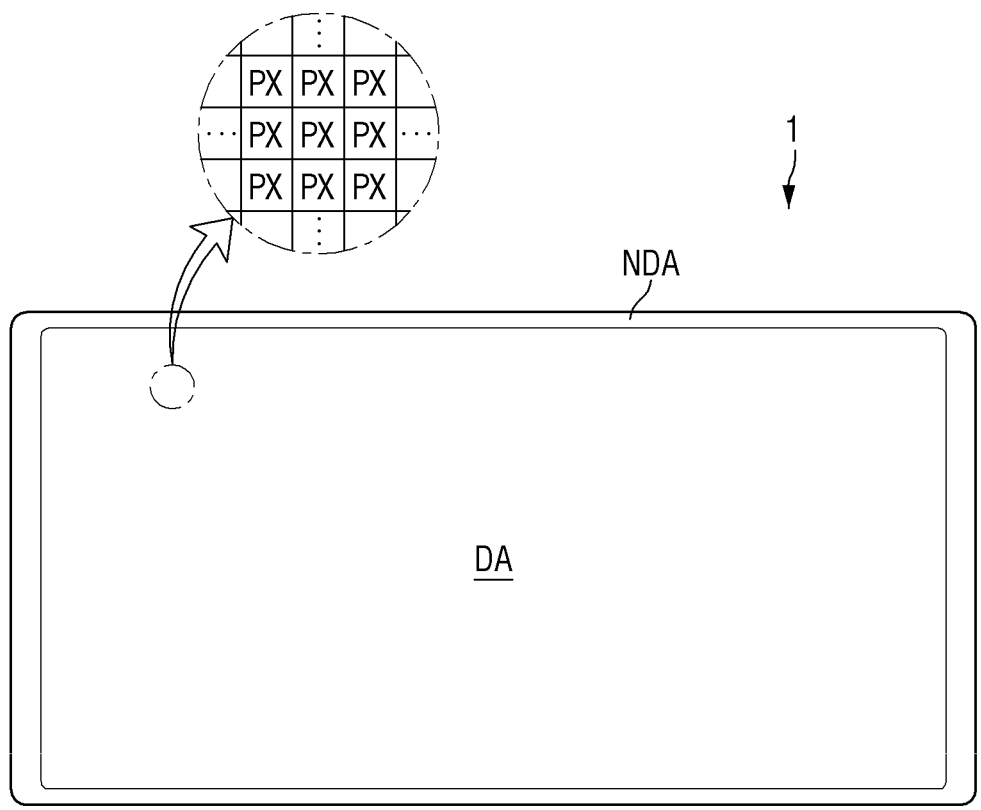
FIG. 1 is a plan view of a display device according to an exemplary embodiment.
Figure 1:
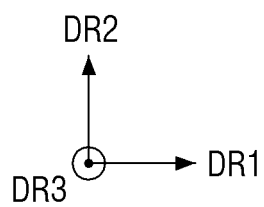
Figure 2:
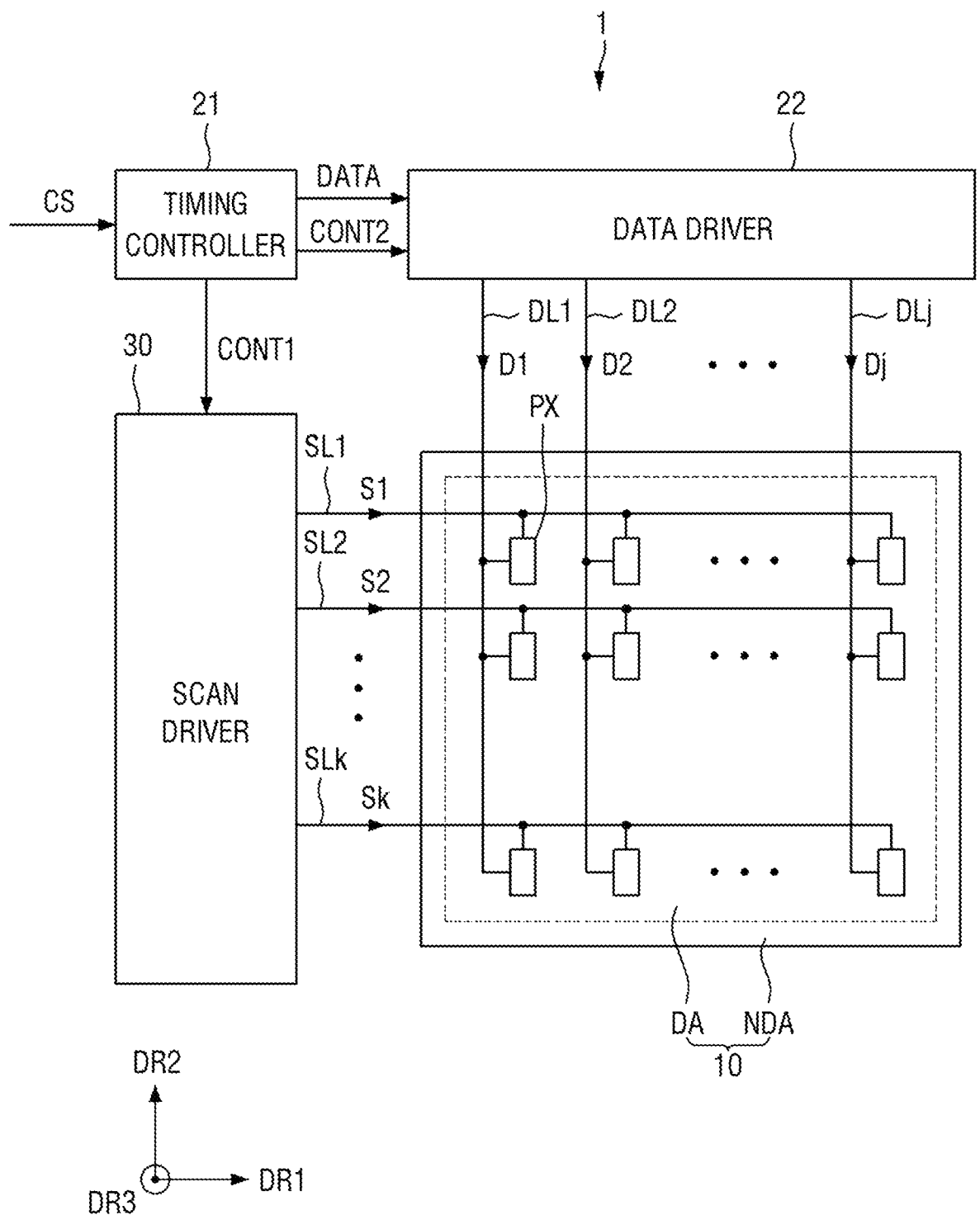
FIG. 2 is a block diagram schematically showing a display device according to an exemplary embodiment.

FIG. 1 is a plan view of a display device according to an exemplary embodiment. FIG. 2 is a block diagram schematically showing a display device according to an exemplary embodiment.

A display device 1 is a device for displaying a moving image or a still image. The display device 1 may be used as a display screen of various suitable products such as, for example, televisions, laptop computers, monitors, billboards and the Internet of Things as well as portable electronic devices such as mobile phones, smart phones, tablet personal computers (tablet PCs), smart watches, watch phones, mobile communication terminals, electronic notebooks, electronic books, portable multimedia players (PMPs), navigation systems, and ultra mobile PCs (UMPCs), but the present disclosure is not limited thereto.

The display device 1 according to an exemplary embodiment may have a substantially rectangular shape in a plan view. The display device 1 may have a rectangular shape with right-angled corners in a plan view. However, the present disclosure is not limited thereto, and the display device 1 may have a rectangular shape with rounded corners in a plan view.

In the drawings, a first direction DR1 indicates a horizontal direction of a display device 1 in a plan view, and a second direction DR2 indicates a vertical direction of the display device 1 in a plan view. Further, a third direction DR3 indicates a thickness direction of the display device 1. The first direction DR1 and the second direction DR2 perpendicularly (e.g., substantially perpendicularly) cross or intersect each other. The third direction DR3 is a direction crossing or intersecting the plane on which the first direction DR1 and the second direction DR2 are located, and perpendicularly (substantially perpendicularly) crosses or intersects both the first direction DR1 and the second direction DR2. It should be understood, however, that any direction mentioned in describing an embodiment refers to a relative direction and that embodiment is not limited to the direction mentioned.

Unless otherwise defined, the terms "above," "top surface," and "upper side," as used herein, refer to a display surface's side of the display device 1, and the terms "below," "bottom surface," and "lower side," as used herein, refer to a side opposite to the display surface of the display device 1.

The display device 1 according to an exemplary embodiment may include a display panel 10, a timing controller 21, a data driver 22, and a scan driver 30.

The display panel 10 may be an organic light emitting display panel. In the following embodiments, a case where the organic light emitting display panel is used as the display panel 10 will be described as an example, but the present disclosure is not limited thereto, and other types or kinds of display panels such as a liquid crystal display (LCD) panel, a quantum dot organic light emitting display (QD-OLED) panel, a quantum dot liquid crystal display (QD-LCD) panel, a quantum-nano light emitting display (QNED) panel and a micro LED panel may be used as the display panel 10.

The display panel 10 may include a display area DA to display an image (or a screen) and a non-display area NDA that is not designed to display an image. The display panel 10 may be divided into the display area DA and the non-display area NDA in a plan view. The non-display area NDA may be located to surround the display area DA. The non-display area NDA may form a bezel.

The display area DA may have a rectangular shape with right-angled or rounded corners in a plan view. However, the planar shape of the display area DA is not limited to a rectangular shape, but may have a circular shape, an elliptical shape, or various other suitable shapes.

The display area DA may include a plurality of pixels PX. The pixels PX may be arranged in a matrix. Each pixel PX may include a light emitting layer and a circuit layer to control the light emission amount of the light emitting layer. The circuit layer may include a wiring, an electrode, and at least one transistor. The light emitting layer may include an organic light emitting material. The light emitting layer may be encapsulated by an encapsulation layer. Hereinafter, a case where the light emitting layer is an organic light emitting layer will be described, but the present disclosure is not limited thereto. A more detailed configuration of the pixel PX will be described herein below.

The non-display area NDA may be adjacent to both the short sides and both the long sides of the display area DA. In this case, the non-display area NDA may surround all sides of the display area DA and form edges of the display area DA. However, the present disclosure is not limited thereto, and the non-display area NDA may be adjacent to both short sides or both long sides of the display area DA.

In the display area DA, not only the pixels PX, but also a plurality of scan lines SL1 to SLk (k is an integer of 2 or more), a plurality of data lines DL1 to DLj (j is an integer of 2 or more) and a plurality of power lines, which are coupled to the pixels PX, may be included. The scan lines SL may extend in the first direction DR1 and may be arranged along the second direction DR2. The data lines DL may extend in the second direction DR2 and may be arranged along the first direction DR1.

The display panel 10 includes the plurality of pixels PX located at crossings or intersections of the plurality of scan lines SL1 to SLk (k is an integer of 2 or more) and the plurality of data lines DL1 to DLj (j is an integer of 2 or more) and arranged in a matrix. Each pixel PX may be coupled to at least one of the scan lines SL and one of the data lines DL.

The timing controller 21 receives digital video data and timing signals from a host system. The timing signals may include a vertical sync signal, a horizontal sync signal, a data enable signal and a dot clock. The host system may be an application processor of a smartphone or tablet PC, a monitor or a system on a chip of a TV, or the like.

The timing controller 21 generates control signals CS for controlling the operation timings of the data driver 22 and the scan driver 30. The control signals CS may include a source control signal CONT2 for controlling the operation timing of the data driver 22 and a scan control signal CONT1 for controlling the operation timing of the scan driver 30.

The scan driver 30 receives the scan control signal CONT1 from the timing controller 21. The scan driver 30 generates scan signals S1 to Sk (k is an integer of 2 or more) according to the scan control signal CONT1 and supplies the scan signals to the scan lines SL1 to SLk of the display panel 10. The scan driver 30 may include a plurality of transistors and may be formed in the non-display area NDA of the display panel 10. In some embodiments, the scan driver 30 may be formed as an integrated circuit, and in this case, may be mounted on a gate flexible film attached to the other side of the display panel 10.

The data driver 22 receives the digital video data DATA and the source control signal CONT2 from the timing controller 21. The data driver 22 converts the digital video data DATA into analog data voltages according to the source control signal CONT2 and supplies the analog data voltages to the data lines DL1 to DLj of the display panel 10. Each of the pixels PX emits light having a set or predetermined luminance by a driving current supplied to a light emitting element according to data signals D1 to Dj (j is an integer of 2 or more) transmitted through the data lines DL1 to DLm.

A power supply circuit may generate voltages required for driving the display panel 10 from a main power source applied from a system board and supply the voltages to the display panel 10. For example, the power supply circuit may provide a first source voltage ELVDD (shown in FIG. 3) and a second source voltage ELVSS (shown in FIG. 3) for driving a light emitting element OLED of the display panel 10 from the main power source, and may supply them to a first power line ELVDL (shown in FIG. 3) and a second power line ELVSL (shown in FIG. 3), respectively, of the display panel 10. Further, the power supply circuit may generate and supply driving voltages for driving the timing controller 21, the data driver 22, the scan driver 30 and the like from the main power source. The power supply circuit may be formed as an integrated circuit and mounted on a circuit board, but the present disclosure is not limited thereto.

Figure 3:
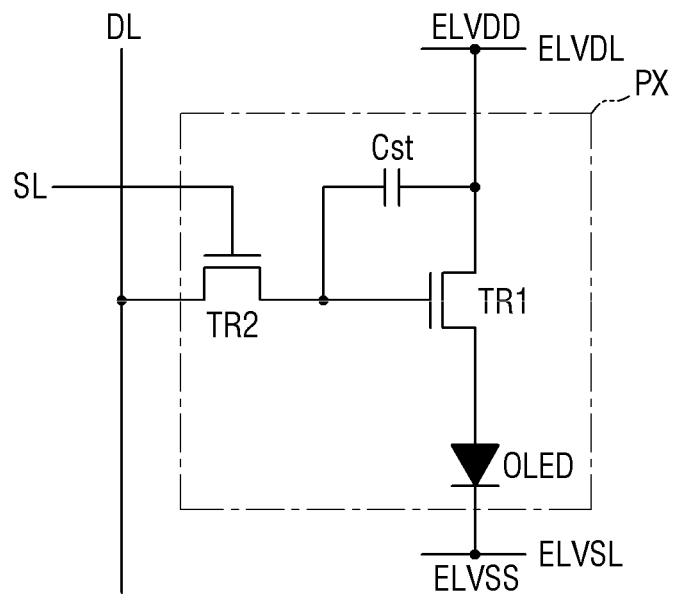
FIG. 3 is an equivalent circuit diagram of one pixel of a display device according to an exemplary embodiment.

FIG. 3 is an equivalent circuit diagram of one pixel of a display device according to an exemplary embodiment.

Referring to FIG. 3, the pixel PX may include a first transistor TR1, a second transistor TR2, a light emitting element OLED and a capacitor Cst. Although FIG. 3 illustrates that each pixel PX has a 2T1C (2Transistor-1Capacitor) structure having two transistors TR1 and TR2 and one capacitor Cst, the present disclosure is not limited thereto. Each pixel PX may include a plurality of transistors and a plurality of capacitors. For example, various modified pixel structures such as a 3T1C structure, a 6T1C structure and/or a 7T1C structure may be applied to each pixel PX.

Each of the first and second transistors TR1 and TR2 may include a first source/drain electrode, a second source/drain electrode and a gate electrode. One of the first source/drain electrode and the second source/drain electrode may be a source electrode, and the other one may be a drain electrode.

Each of the first and second transistors TR1 and TR2 may be formed of a thin film transistor. Further, although FIG. 3 illustrates that each of the first and second transistors TR1 and TR2 is formed of an N-type metal oxide semiconductor field effect transistor (MOSFET), the present disclosure is not limited thereto. Each of the first transistor TR1 and the second transistor TR2 may be formed of a P-type MOSFET. In this case, the positions of the source electrode and the drain electrode of each of the first transistor TR1 and the second transistor TR2 may be changed. In the following description, it is assumed that the first and second transistors TR1 and TR2 are N-type MOSFETs.

The first transistor TR1 may be a driving transistor. For example, the gate electrode of the first transistor TR1 is coupled to the second source/drain electrode of the second transistor TR2 and the second electrode of the capacitor Cst. The first source/drain electrode of the first transistor TR1 is coupled to the first power line ELVDL. The second source/drain electrode of the first transistor TR1 is coupled to an anode electrode (or pixel electrode) of the light emitting element OLED. The first transistor TR1 receives a data signal Dj (j is an integer of 1 or more) according to a switching operation of the second transistor TR2 to supply a driving current to the light emitting element OLED.

The gate electrode of the second transistor TR2 is coupled to the scan line SL. The first source/drain electrode of the second transistor TR2 is coupled to the data line DL. The second source/drain electrode of the second transistor TR2 is coupled to the gate electrode of the first transistor TR1 and the second electrode of the capacitor Cst. The second transistor TR2 is turned on according to the scan signal Sk (k is an integer of 1 or more) to perform a switching operation of transmitting the data signal Dj (j is an integer of 1 or more) to the gate electrode of the first transistor TR1.

The first electrode of the capacitor Cst may be coupled to the first power line ELVDL and the first source/drain electrode of the first transistor TR1, and the second electrode of the capacitor Cst may be coupled to the gate electrode of the first transistor TR1 and the second source/drain electrode of the second transistor TR2. The capacitor Cst may serve to keep constant (e.g., substantially constant) the data voltage applied to the gate electrode of the first transistor TR1.

The light emitting element OLED may emit light according to the driving current of the first transistor TR1. The light emitting element OLED may be an organic light emitting diode including an anode electrode (or a first electrode), an organic light emitting layer and a cathode electrode (or a second electrode). The anode electrode of the light emitting element OLED may be coupled to the second source/drain electrode of the first transistor TR1, and the cathode electrode of the light emitting element OLED may be coupled to the second power line ELVSL to which the second source voltage ELVSS (which is lower than the first source voltage ELVDD) is applied.

Hereinafter, the planar arrangement and the cross-sectional structure of embodiments of the above-described pixels PX will be described in more detail.

Figure 4:
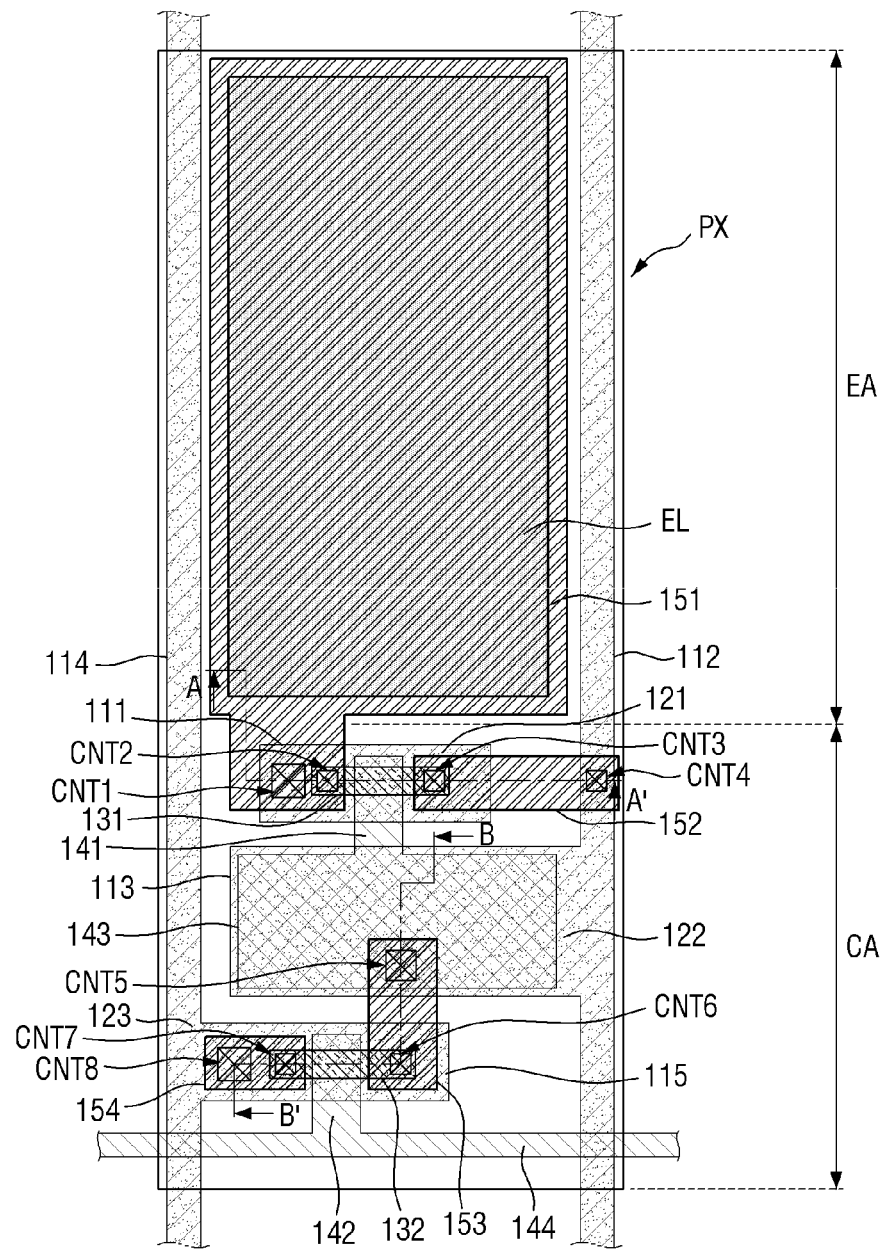
FIG. 4 is a layout diagram of one pixel of a display device according to an exemplary embodiment.
Figure 5:
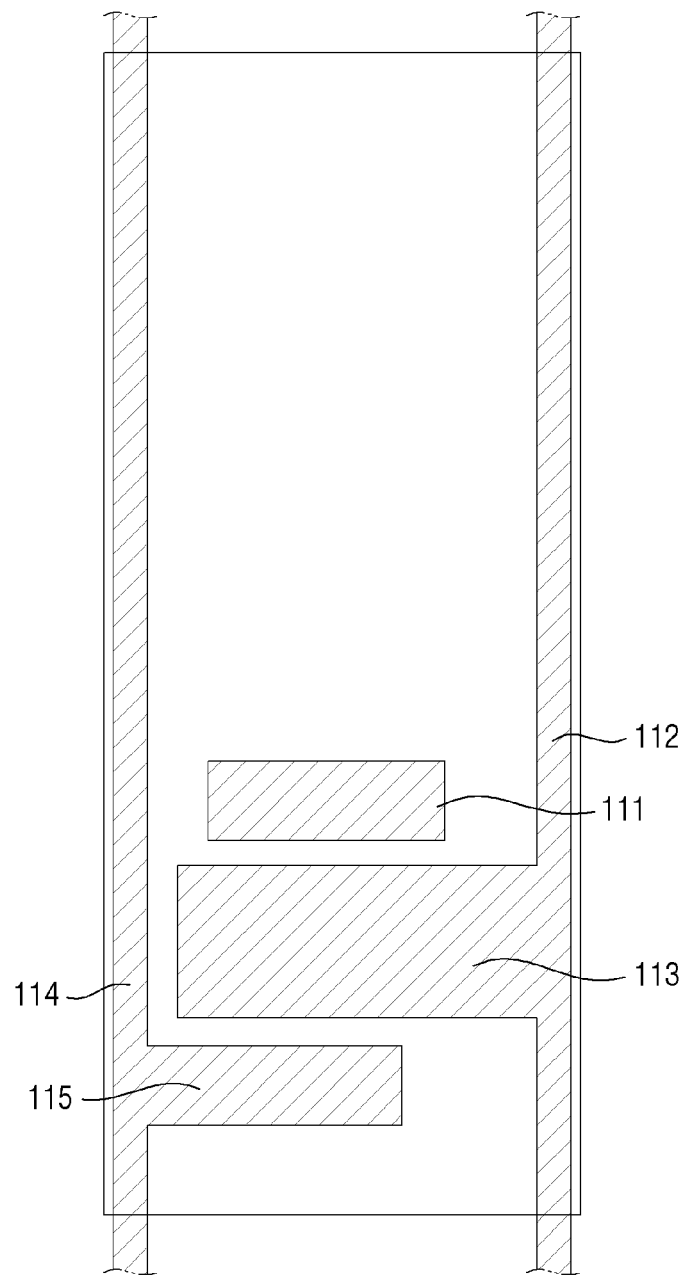
FIG. 5 is a layout diagram of a first conductive layer according to an exemplary embodiment.
Figure 5:
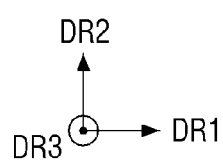
Figure 6:
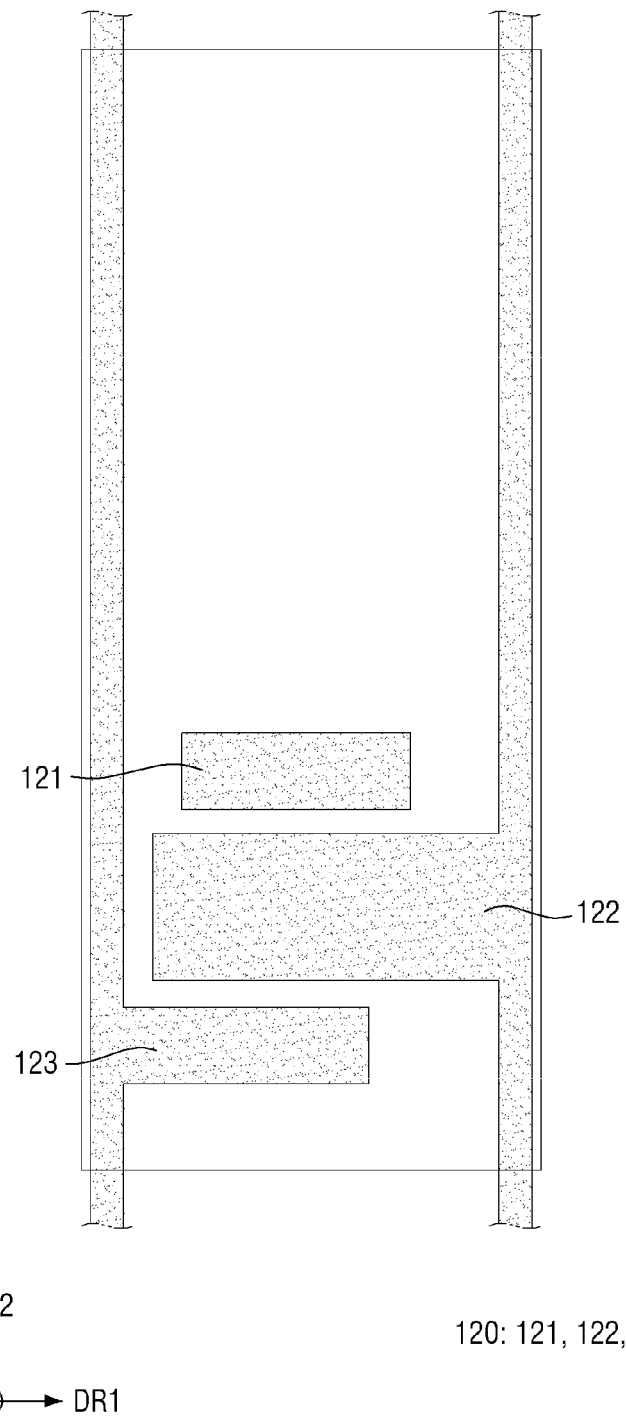
FIG. 6 is a layout diagram of a buffer layer according to an exemplary embodiment.
Figure 7:
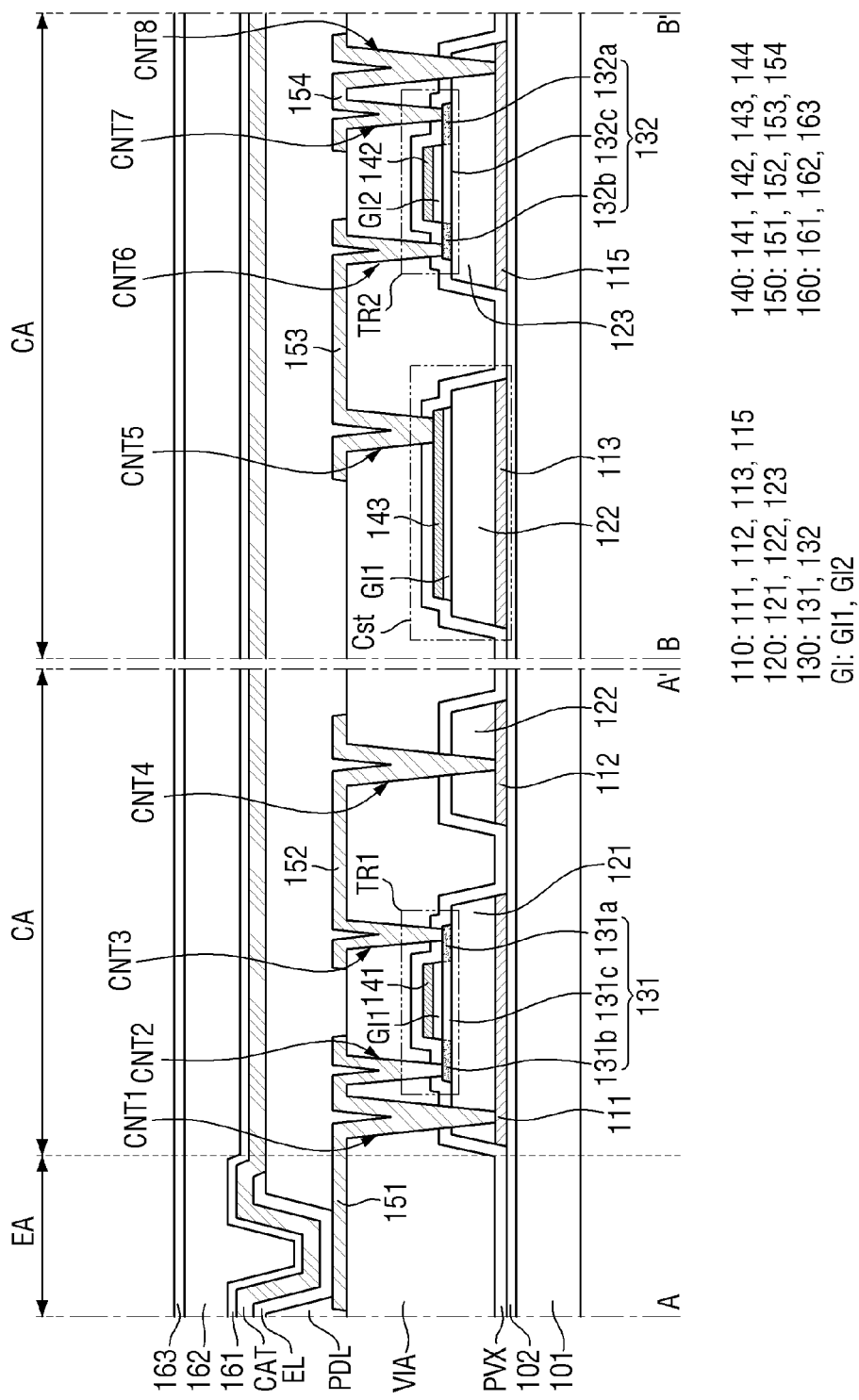
FIG. 7 is a cross-sectional view taken along lines A-A' and B-B' of FIG. 4.

FIG. 4 is a layout diagram of one pixel of a display device according to an exemplary embodiment. FIG. 5 is a layout diagram of a first conductive layer according to an exemplary embodiment. FIG. 6 is a layout diagram of a buffer layer according to an exemplary embodiment. FIG. 7 is a cross-sectional view taken along lines A-A' and B-B' of FIG. 4.

In the following embodiments, some of the elements are denoted by new reference numerals to facilitate a description of the arrangement and coupling relationship between the elements even though they are substantially the same as the elements mentioned with reference to FIGS. 1 to 3.

Referring to FIGS. 4 to 7, one pixel PX may include a light emission area EA and a circuit area CA. The light emission area EA is an area in which the light emitting element OLED is to emit light. The circuit area CA includes a first transistor ("TR1" in FIG. 3, hereinafter the same (TR1)) electrically coupled to the first power line ("ELVDL" in FIG. 3, hereinafter 113), the data line ('DL' in FIG. 3, hereinafter 114) and the scan line ("SL" in FIG. 3, hereinafter 144), a second transistor ("TR2" in FIG. 3, hereinafter the same (TR2)), and a capacitor ("Cst" in FIG. 3, hereinafter the same (Cst)).

Each of the transistors TR1 and TR2 includes a conductive layer that forms an electrode, a semiconductor pattern that forms a channel, and an insulating layer. The capacitor Cst includes conductive layers forming an electrode and an insulating layer between the conductive layers. For example, the capacitor Cst includes a first electrode 113 (or a lower electrode of the capacitor) of the capacitor Cst and a second electrode 143 (or an upper electrode of the capacitor) of the capacitor Cst and an insulating layer therebetween. The above-described conductive material, conductive layer, semiconductor layer, and insulating layer are on a base substrate 101.

The display panel 10 according to an exemplary embodiment includes a semiconductor layer 130, a plurality of conductive layers and a plurality of insulating layers on the base substrate 101. The plurality of conductive layers may include a first conductive layer 110, a second conductive layer 140, and a third conductive layer 150. The plurality of insulating layers may include a buffer layer 120, a gate insulating layer GI, a passivation layer PVX and a via layer VIA. The respective layers of the display panel 10 may include a barrier layer 102, the first conductive layer 110, the buffer layer 120, the semiconductor layer 130, the gate insulating layer GI, the second conductive layer 140, the passivation layer PVX, the via layer VIA, the third conductive layer 150 and a pixel defining layer PDL which are on the base substrate 101 in this order. Each of the layers described above may include (or consist of) a single layer, or a stack of multiple layers. Other layers may be further between the layers.

The base substrate 101 supports the respective layers thereon. The base substrate 101 may be made of, for example, an insulating material such as a polymer resin. Examples of a polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The base substrate 101 may include a metal material.

The base substrate 101 may be a flexible substrate which can be bent, folded or rolled. An example of the material of the flexible substrate may be polyimide (PI), but is not limited thereto.

A transparent substrate may be used when the organic light emitting display device is a bottom emission type (e.g., a bottom emission kind of display device) or a double-sided emission type (e.g., a double-sided emission kind of display device). When the organic light emitting display device is a top emission type (e.g., a top emission kind of display device), in addition to a transparent substrate, a translucent or opaque substrate may be applied.

The barrier layer 102 may be on the base substrate 101. The barrier layer 102 can prevent or reduce diffusion of impurity ions, prevent or reduce penetration of moisture or external air, and perform a surface planarization function. The barrier layer 102 may include silicon nitride, silicon oxide, silicon oxynitride, and/or the like. The barrier layer 102 may be omitted depending on the type or composition of the base substrate 101, process conditions, and the like.

The first conductive layer 110 is on the barrier layer 102. However, the present disclosure is not limited thereto, and when the barrier layer 102 is omitted, the first conductive layer 110 may be on the base substrate 101. The first conductive layer 110 may have the same (e.g., substantially the same) shape as the buffer layer 120 in a plan view, which will be described in more detail herein below.

The first conductive layer 110 may include a first lower light blocking pattern 111, a first power line 112, the first electrode 113 of the capacitor Cst, the data line 114, and a second lower light blocking pattern 115.

The first lower light blocking pattern 111 may serve to prevent or reduce entrance of light incident from the bottom side of the display panel 10 into a semiconductor pattern 131 of the first transistor TR1, for example, a channel region 131c of the semiconductor pattern 131 thereabove. The first lower light blocking pattern 111 may cover the semiconductor pattern 131 of the first transistor TR1 thereabove. The first lower light blocking pattern 111 may be larger than the semiconductor pattern 131 of the first transistor TR1 in a plan view, and the entire area of the semiconductor pattern 131 of the first transistor TR1 may overlap the first lower light blocking pattern 111 in the thickness direction (third direction DR3). However, the present disclosure is not limited thereto, and the first lower light blocking pattern 111 may cover at least the channel region 131c of the semiconductor pattern 131 of the first transistor TR1, and may overlap at least the channel region 131c of the semiconductor pattern 131 of the first transistor TR1. Further, the first lower light blocking pattern 111 may be smaller than the semiconductor pattern 131 of the first transistor TR1.

The first lower light blocking pattern 111 is between the first power line 112 and the data line 114 and may be formed in an island shape. For example, the first lower light blocking pattern 111 may be spaced apart from the second lower light blocking pattern 115, the first power line 112, the first electrode 113 of the capacitor Cst and the data line 114.

The first power line 112 may be on the right side of one pixel PX in a plan view. The first power line 112 may extend in the second direction DR2. The first power line 112 may extend to another pixel PX located adjacent to one pixel PX in the second direction DR2.

The first electrode 113 of the capacitor Cst may be formed to protrude in the first direction DR1 from one side of the first power line 112. For example, the first lower light blocking pattern 111 may be branched from the first power line 112 and may extend in the first direction DR1. The first electrode 113 of the capacitor Cst may be near the center of the circuit area CA. The first electrode 113 of the capacitor Cst is not limited thereto, but may be between the first lower light blocking pattern 111 and the second lower light blocking pattern 115.

The data line 114 is on the left side of one pixel PX in a plan view and may extend in the second direction DR2. The data line 114 may extend to another pixel PX located adjacent to one pixel PX in the second direction DR2. The data line 114 may be on the left side of the first power line 112 while being spaced apart from the first power line 112.

The second lower light blocking pattern 115 may serve to prevent or reduce entrance of light incident from the bottom side of the display panel 10 into a semiconductor pattern 132 of the second transistor TR2, for example, a channel region 132c of the semiconductor pattern 132 thereabove. The second lower light blocking pattern 115 may cover the semiconductor pattern 132 of the second transistor TR2 thereabove. The second lower light blocking pattern 115 may be larger than the semiconductor pattern 132 of the second transistor TR2 in a plan view, and the entire area of the semiconductor pattern 132 of the second transistor TR2 may overlap the second lower light blocking pattern 115 in the thickness direction (third direction DR3). However, the present disclosure is not limited thereto, and the second lower light blocking pattern 115 may cover at least the channel region 131c of the semiconductor pattern 132 of the second transistor TR2, and may overlap at least the channel region 131c of the semiconductor pattern 132 of the second transistor TR2. Further, the second lower light blocking pattern 115 may be smaller than the semiconductor pattern 132 of the second transistor TR2.

The second lower light blocking pattern 115 may be formed to protrude in a first direction DR1 from one side of the data line 114. For example, the second lower light blocking pattern 115 may be branched from the data line 114 and may extend in the first direction DR1.

The first conductive layer 110 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 110 may be a single layer or a multilayer.

The buffer layer 120 is on the first conductive layer 110. The buffer layer 120 may serve as an interlayer insulating layer that insulates between the first conductive layer 110 and the semiconductor layer 130. The buffer layer 120 may be formed in the same (e.g., substantially the same) planar shape as the semiconductor layer 130. The entire area of the buffer layer 120 may overlap the first conductive layer 110.

The buffer layer 120 may include a first buffer pattern 121, a second buffer pattern 122, and a third buffer pattern 123.

The first buffer pattern 121 may be included for each pixel PX, and the second buffer pattern 122 and the third buffer pattern 123 may be over a plurality of pixels PX. The first buffer pattern 121, the second buffer pattern 122, and the third buffer pattern 123 may be spaced apart from each other.

The first buffer pattern 121 may be on the first lower light blocking pattern 111 and may be formed in the same (e.g., substantially the same) planar shape as the first lower light blocking pattern 111. The entire area of the first buffer pattern 121 may overlap the first lower light blocking pattern 111. The side surface of the first buffer pattern 121 may be aligned with the side surface of the first lower light blocking pattern 111. However, the present disclosure is not limited thereto, and the entire area of the first buffer pattern 121 may overlap the first lower light blocking pattern 111, while the length of the first buffer pattern 121 in the first direction DR1 and the width of the first buffer pattern 121 in the second direction DR2 may be smaller than the length of the first lower light blocking pattern 111 in the first direction DR1 and the width of the first lower light blocking pattern 111 in the second direction DR2, respectively.

The second buffer pattern 122 may be on the first power line 112 and the first electrode 113 of the capacitor Cst, and may be in the same (e.g., substantially the same) planar shape as the first power line 112 and the first electrode 113 of the capacitor Cst. The second buffer pattern 122 may overlap the first power line 112 and the first electrode 113 of the capacitor Cst. The side surface of the second buffer pattern 122 may be aligned with at least a portion of the side surface of the first power line 112 and the side surface of the first electrode 113 of the capacitor Cst. However, the present disclosure is not limited thereto, and the second buffer pattern 122 may be formed in the same (e.g., substantially the same) planar shape as the first power line 112 and the first electrode 113 of the capacitor Cst, and the entire area of the second buffer pattern 122 may overlap the first power line 112 and the first electrode 113 of the capacitor Cst, while the size of the second buffer pattern 122 may be smaller than the size of the first power line 112 and the first electrode 113 of the capacitor Cst.

The third buffer pattern 123 may be on the data line 114 and the second lower light blocking pattern 115 and may be formed in the same (e.g., substantially the same) planar shape as the data line 114 and the second lower light blocking pattern 115. The third buffer pattern 123 may overlap the data line 114 and the second lower light blocking pattern 115. The side surface of the third buffer pattern 123 may be aligned with at least a portion of the side surface of the data line 114 and the side surface of the second lower light blocking pattern 115. However, the present disclosure is not limited thereto, and the third buffer pattern 123 may be formed in the same (e.g., substantially the same) planar shape as the data line 114 and the second lower light blocking pattern 115, and the entire area of the third buffer pattern 123 may overlap the data line 114 and the second lower light blocking pattern 115, while the size of the third buffer pattern 123 may be smaller than the size of the data line 114 and the second lower light blocking pattern 115.

The second conductive layer 140, the passivation layer PVX and/or the via layer VIA may be in a space between the first buffer pattern 121, the second buffer pattern 122 and the third buffer pattern 123. For example, a space where the first buffer pattern 121 and the second buffer pattern 122 are not in a first buffer opening OPB1 and a second buffer opening OPB2 may be filled with the passivation layer PVX and/or the via layer VIA.

The buffer layer 120 may include at least one of silicon nitride, silicon oxide, and/or silicon oxynitride. The buffer layer 120 may be omitted depending on the type or composition of the base substrate 101, process conditions, and the like.

The semiconductor layer 130 may be on the buffer layer 120. The entire area of the semiconductor layer 130 may overlap the buffer layer 120, and the size of the semiconductor layer 130 may be smaller than the size of the buffer layer 120. The semiconductor layer 130 may be in the circuit area CA.

In some embodiments, the semiconductor layer 130 may include the semiconductor pattern 131 of the first transistor TR1 and the semiconductor pattern 132 of the second transistor TR2. The semiconductor pattern 131 of the first transistor TR1 may be an active layer of the first transistor TR1, and the semiconductor pattern 132 of the second transistor TR2 may be an active layer of the second transistor TR2. The semiconductor pattern 131 of the first transistor TR1 and the semiconductor pattern 132 of the second transistor TR2 may be arranged for each pixel PX.

The semiconductor pattern 131 of the first transistor TR1 and the semiconductor pattern 132 of the second transistor TR2 may extend in the first direction DR1 and may be spaced apart from each other. The semiconductor pattern 131 of the first transistor TR1 and the semiconductor pattern 132 of the second transistor TR2 may be formed in an island shape. For example, the semiconductor pattern 131 of the first transistor TR1 and the semiconductor pattern 132 of the second transistor TR2 may each have physically disconnected patterns that do not contact each other (e.g., are in an island shape). However, the present disclosure is not limited thereto, and the semiconductor pattern 131 of the first transistor TR1 and/or the semiconductor pattern 132 of the second transistor TR2 may extend in the second direction DR2.

Although not limited thereto, the semiconductor pattern 131 of the first transistor TR1 may be on the first buffer pattern 121, and the entire area thereof may overlap the first lower light blocking pattern 111 and the first buffer pattern 121 therebelow. Further, the semiconductor pattern 132 of the second transistor TR2 may be on the second buffer pattern 122, and the entire area thereof may overlap the second lower light blocking pattern 115 and the third buffer pattern 123 therebelow.

The semiconductor pattern 131 of the first transistor TR1 may include the channel region 131c of the first transistor TR1 to overlap a gate electrode 141 of the first transistor TR1 located thereabove in the thickness direction, and a first source/drain region 131a of the first transistor TR1 and a second source/drain region 131b of the first transistor TR1 located on one side and the other side of the channel region 131c, respectively. The first and second source/drain regions 131a and 131b of the first transistor TR1 are conductorized regions, and may have greater conductivity (e.g., electrical conductivity) and lower electrical resistance than the channel region 131c of the first transistor TR1.

The semiconductor pattern 132 of the second transistor TR2 may include the channel region 132c of the second transistor TR2 to overlap a gate electrode 142 of the second transistor TR2 located thereabove in the thickness direction, and a first source/drain region 132a of the second transistor TR2 and a second source/drain region 132b of the second transistor TR2 located on one side and the other side of the channel region 132c, respectively. The first and second source/drain regions 132a and 132b of the second transistor TR2 are conductorized regions, and may have greater conductivity (e.g., electrical conductivity) and lower electrical resistance than the channel region 131c of the first transistor TR1.

The passivation layer PVX and/or the via layer VIA may be in a space between the semiconductor pattern 131 of the first transistor TR1 and the semiconductor pattern 132 of the second transistor TR2.

The semiconductor layer 130 may be formed of an oxide semiconductor. The oxide semiconductor may include, for example, a binary compound (ABx), a ternary compound (ABxCy), or a quaternary compound (ABxCyDz) including indium (In), zinc (Zn), gallium (Ga), tin (Sn), titanium (Ti), aluminum (Al), hafnium (Hf), zirconium (Zr), magnesium (Mg), and/or the like. In an exemplary embodiment, the semiconductor layer 130 may include indium tin zinc oxide (ITZO) and/or indium gallium zinc oxide (IGZO).

The gate insulating layer GI is on the semiconductor layer 130. The gate insulating layer GI may be formed in the same (e.g., substantially the same) planar shape as the upper second conductive layer 140. For example, the gate insulating layer GI may overlap a portion of the semiconductor layer 130. The gate insulating layer GI may cover the channel regions 131c and 132c of the semiconductor layer 130 and may expose the first and second source/drain regions 131a, 131b, 132a and 132b and the side surfaces of the semiconductor layer 130.

The gate insulating layer GI may include a first gate insulating layer region GI1 and a second gate insulating layer region GI2. The first gate insulating layer region GI1 may serve as a gate insulating layer of the first transistor TR1 in some regions, and may serve as a dielectric of the capacitor Cst in some other regions. The second gate insulating layer region GI2 may serve as a gate insulating layer of the second transistor TR2.

The first gate insulating layer region Gi1 may overlap the gate electrode 141 of the first transistor TR1 and the second electrode 143 of the capacitor Cst located thereabove, and the gate electrode 141 of the first transistor TR1 and the second electrode 143 of the capacitor Cst may have substantially the same (e.g., substantially the same) planar shape. The second gate insulating layer region GI2 may overlap the gate electrode 142 of the second transistor TR2 and the scan line 144 located thereabove, and the gate electrode 142 and the gate electrode 142 of the second transistor TR2 and the scan line 144 may have the substantially same (e.g., substantially the same) planar shape.

The gate insulating layer GI may include a silicon compound, a metal oxide, and/or the like. For example, the gate insulating layer GI may include silicon oxide, silicon nitride, silicon oxynitride, aluminum oxide, tantalum oxide, hafnium oxide, zirconium oxide, titanium oxide, and/or the like. These may be used alone or in combination with each other.

The second conductive layer 140 is on the gate insulating layer GI. The second conductive layer 140 may include the gate electrode 141 of the first transistor TR1, the gate electrode 142 of the second transistor TR2, the second electrode 143 (or the upper electrode) of the capacitor Cst, and the scan line ("SL" in FIG. 3, hereinafter 144). Although not limited thereto, the second conductive layer 140 may have the same (e.g., substantially the same) shape as the gate insulating layer GI, and may overlap the gate insulating layer GI.

Although not limited thereto, the gate electrode 141 of the first transistor TR1 may be formed to protrude in the second direction DR2 from one side of the second electrode 143 of the capacitor Cst. The gate electrode 141 of the first transistor TR1 may be branched in the second direction DR2 from the second electrode 143 of the capacitor Cst, and may overlap the channel region 131c of the semiconductor pattern 131 of the first transistor TR1. The gate electrode 142 of the second transistor TR2 may be formed to protrude from one side of the scan line 144. The gate electrode 142 of the second transistor TR2 may be branched from the scan line 144 in the second direction DR2 and may overlap the channel region 132c of the semiconductor pattern 132 of the second transistor TR2.

The second electrode 143 of the capacitor Cst may be at the center of the circuit area CA, may be located between the first lower light blocking pattern 111 and the second lower light blocking pattern 115 in a plan view, and may partially extend to be coupled to the gate electrode 141 of the first transistor TR1.

The second electrode 143 of the capacitor Cst may be on the first electrode 113 of the capacitor Cst to overlap at least a portion of the first electrode 113 of the capacitor Cst. The shape of the second electrode 143 of the capacitor Cst may be substantially similar to the shape of the first electrode 113 of the capacitor Cst. The second electrode 143 of the capacitor Cst may be formed to have an area smaller than the area of the first electrode 113 of the capacitor Cst to expose a portion of the first electrode 113 of the capacitor Cst.

The second electrode 143 of the capacitor Cst may overlap the first electrode 113 of the capacitor Cst with the second buffer pattern 122 of the buffer layer 120 and a third gate insulating layer region GI3 of the gate insulating layer GI interposed therebetween, thereby forming the capacitor Cst. The second buffer pattern 122 of the buffer layer 120 interposed between the first electrode 113 of the capacitor Cst and the second electrode 143 of the capacitor Cst, and the third gate insulating layer region GI3 of the gate insulating layer GI may be a dielectric of the capacitor Cst.

Although not limited thereto, the second electrode 143 of the capacitor Cst and the gate electrode 141 of the first transistor TR1 may be integrally formed into one second conductive layer pattern.

The scan line 144 may be below one pixel PX (or below the circuit area CA) in a plan view. The scan line 144 may extend in the first direction DR1. The scan line 144 may extend to another pixel PX located adjacent to one pixel PX in the first direction DR1. The scan line 144 may be on a different layer from the first power line 112 and the data line 114, and may be above the first power line 112 and the data line 114. The scan line 144 may extend in the first direction DR1 and cross or intersect the first power line 112 and the data line 114 extending in the second direction DR2. However, in a portion where the scan line 144, the first power line 112 and the data line 114 cross or intersect, one or more insulating layers (e.g., the gate insulating layer GI) may be between the scan line 144, the first power line 112 and the data line 114, thereby achieving insulation between the scan line 144, the first power line 112 and the data line 114. The scan line 144 may be below the second electrode 143 of the capacitor Cst and spaced apart from the second electrode 143 of the capacitor Cst.

The second conductive layer 140 may be made of a low resistance material. The second conductive layer 140 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), but is not limited thereto.

The passivation layer PVX is on the second conductive layer 140. The passivation layer PVX may cover and protect the second conductive layer 140. The passivation layer PVX may be on the second conductive layer 140 as well as on the buffer layer 120 and the first conductive layer 110.

In some embodiments, the passivation layer PVX may not only cover the top and side surfaces of the second conductive layer 140, but also cover the top and/or side surface of the gate insulating layer GI, the top and/or side surface of the semiconductor layer 130, the top and/or side surface of the buffer layer 120, the top and/or side surface of the first conductive layer, and the top surface of the barrier layer 102.

The passivation layer PVX may include an inorganic insulating material such as silicon oxide, silicon nitride, silicon oxynitride, hafnium oxide, aluminum oxide, titanium oxide, tantalum oxide, zinc oxide, and/or the like. In some embodiments, the passivation layer PVX may be formed in the display area DA, and may be at least partially unformed in the non-display area NDA.

The via layer VIA (or planarization layer) is on the passivation layer PVX. The via layer VIA may be on the passivation layer PVX to completely cover the top surface of the passivation layer PVX. The via layer VIA may be not only on the top and side surfaces of the second conductive layer 140, but also on the top and/or side surface of the gate insulating layer GI, the top and/or side surface of the semiconductor layer 130, the top and/or side surface of the buffer layer 120, the top and/or side surface of the first conductive layer, and the top surface of the barrier layer 102. When the via layer VIA is made of an organic layer, the upper surface thereof may be flat (e.g., substantially flat) despite a lower step.

The via layer VIA may include an inorganic insulating material or an organic insulating material selected from the group consisting of acrylic resin, epoxy resin, phenolic resin, polyamide resin, polyimide resin, unsaturated polyester resin, polyphenylene resin, polyphenylenesulfide resin, and benzocyclobutene (BCB). The via layer VIA may further include a photosensitive material, but the present disclosure is not limited thereto.

The third conductive layer 150 is on the via layer VIA. The third conductive layer may include a first conductive pattern 151, a second conductive pattern 152, a third conductive pattern 153 and a fourth conductive pattern 154. The conductive patterns 151, 152, 153 and 154 may be physically spaced apart from each other. The conductive patterns 151, 152, 153 and 154 may electrically couple the physically spaced portions.

The first conductive pattern 151 may include an anode electrode of the light emitting element ("OLED" in FIG. 3). The first conductive pattern 151 may be included separately for each pixel. At least a portion of the first conductive pattern 151 may overlap the first lower light blocking pattern 111 and overlap the semiconductor pattern 131 of the first transistor TR1.

The first conductive pattern 151 may pass through the via layer VIA, the passivation layer PVX and the buffer layer 120 in the overlapping region, and may contact (e.g., physically contact) the first lower light blocking pattern 111 through a contact hole CNT1 exposing a portion of the first lower light blocking pattern 111. Further, the first conductive pattern 151 may pass through the via layer VIA and the passivation layer PVX in the overlapping region, and may contact (e.g., physically contact) the second source/drain region 131b of the first transistor TR1 through a contact hole CNT2 exposing a portion of the second source/drain region 131b of the first transistor TR1. Accordingly, the first conductive pattern 151 itself may become the second source/drain electrode of the first transistor TR1, or at least a portion of the first conductive pattern 151 may become the second source/drain electrode of the first transistor TR1. In addition, the second source/drain region 131b of the first transistor and the first lower light blocking pattern 111 may be electrically coupled to each other by the first conductive pattern 151.

The second conductive pattern 152 may overlap the first lower light blocking pattern 111, the semiconductor pattern 131 of the first transistor TR1, and the first power line 112. The second conductive pattern 152 may pass through the via layer VIA and the passivation layer PVX in the overlapping region, and may contact (e.g., physically contact) the first source/drain region 131a of the first transistor TR1 through a contact hole CNT3 exposing a portion of the first source/drain region 131a of the first transistor TR1. Accordingly, the second conductive pattern 152 itself may become the first source/drain electrode of the first transistor TR1, or at least a portion of the second conductive pattern 152 may become the first source/drain electrode of the first transistor TR1. In addition, the second conductive pattern 152 may pass through the via layer VIA, the passivation layer PVX and the buffer layer 120 in the overlapping region, and may contact (e.g., physically contact) the first power line 112 through a contact hole CNT4 exposing a portion of the first power line 112. Thus, the first source/drain region 131a of the first transistor TR1 and the first power line 112 may be electrically coupled to each other by the second conductive pattern 152.

The third conductive pattern 153 may overlap the first electrode 113 of the capacitor Cst, the second electrode 143 of the capacitor Cst, the semiconductor pattern 132 of the second transistor TR2 and the second lower light blocking pattern 115. The third conductive pattern 153 may pass through the via layer VIA and the passivation layer PVX in the overlapping region, and may contact the second electrode 143 of the capacitor Cst through a contact hole CNT5 exposing a portion of the second electrode 143 of the capacitor Cst. Further, the third conductive pattern 153 may pass through the via layer VIA and the passivation layer PVX in the overlapping region, and may contact (e.g., physically contact) the second source/drain region 132b of the second transistor TR2 through a contact hole CNT6 exposing a portion of the second source/drain region 132b of the second transistor TR2. Accordingly, the third conductive pattern 153 itself may become the second source/drain electrode of the second transistor TR2, or at least a portion of the third conductive pattern 153 may become the second source/drain electrode of the first transistor TR1. In addition, the second electrode 143 of the capacitor Cst and the second source/drain region 132b of the second transistor TR2 may be electrically coupled to each other by the third conductive pattern 153.

The fourth conductive pattern 154 may overlap the second lower light blocking pattern 115 and the semiconductor pattern 132 of the second transistor TR2. The fourth conductive pattern 154 may pass through the via layer VIA and the passivation layer PVX in the overlapping region, and may contact (e.g., physically contact) the first source/drain region 131b of the second transistor TR2 through a contact hole CNT7 exposing a portion of the first source/drain region 131b of the second transistor TR2. Accordingly, the fourth conductive pattern 154 itself may become the first source/drain electrode of the second transistor TR2, or at least a portion of the fourth conductive pattern 154 may become the first source/drain electrode of the second transistor TR2. Further, the fourth conductive pattern 154 may pass through the via layer VIA, the passivation layer PVX and the buffer layer 120 in the overlapping region, and may contact (e.g., physically contact) the second lower light blocking pattern 115 through a contact hole CNT8 exposing a portion of the second lower light blocking pattern 115. Thus, the first source/drain region 131b of the second transistor TR2 and the second lower light blocking pattern 115 may be electrically coupled to each other by the fourth conductive pattern 154.

As the first and second source/drain electrodes of each of the transistors TR1 and TR2 are made of the first conductive pattern 151 including the anode electrode of the light emitting element OLED, or are on the same side as the first conductive pattern 151, a separate mask process for forming the first and second source/drain electrodes may be unnecessary. Therefore, the number of mask processes for fabricating the display device 1 can be reduced, and the process efficiency can be increased.

The third conductive layer 150 may have a stacked structure formed by stacking a material layer having a high work function, such as indium tin oxide (ITO), indium zinc oxide (IZO), zinc oxide (ZnO) and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but is not limited thereto. The layer having a high work function may be above the reflective material layer and closer to a light emitting layer EL. The third conductive layer 150 may have a multilayer structure such as ITO/Mg, ITO/MgF, ITO/Ag and/or ITO/Ag/ITO, but is not limited thereto.

The pixel defining layer PDL may be on the third conductive layer 150. The pixel defining layer PDL may include an opening partially exposing the first conductive pattern 151 of the third conductive layer 150. The pixel defining layer PDL may be formed of an organic insulating material or an inorganic insulating material. For example, the pixel defining layer PDL may include at least one of a polyimide resin, an acrylic resin, a silicon compound, a polyacrylic resin, and/or the like.

The light emitting layer EL, a cathode electrode CAT and a thin film encapsulation layer 160 may be further on the first conductive pattern 151 exposed by the pixel defining layer PDL.

The light emitting layer EL may include an organic material layer. The organic material layer of the light emitting layer may include an organic light emitting layer, and may further include a hole injecting/transporting layer and/or an electron injecting/transporting layer.

The cathode electrode CAT may be on the light emitting layer EL. The cathode electrode CAT may be a common electrode that is entirely without distinction of pixels PX (e.g., the cathode electrode CAT may be a contiguous common electrode). Each of the anode electrode 151, the light emitting layer EL and the cathode electrode CAT may constitute (e.g., may together form) an organic light emitting element OLED.

The cathode electrode CAT may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The cathode electrode CAT may further include a transparent metal oxide layer on the material layer having a low work function.

The thin film encapsulation layer 160 is on the cathode electrode CAT. The thin film encapsulation layer 160 may include a first inorganic layer 161, a first organic layer 162 and a second inorganic layer 163. In some embodiments, the first inorganic layer 161 and the second inorganic layer 163 may be in contact (e.g., physical contact) with each other at the end of the thin film encapsulation layer 160. The first organic layer 162 may be encapsulated by the first inorganic layer 161 and the second inorganic layer 163.

Each of the first inorganic layer 161 and the second inorganic layer 163 may include silicon nitride, silicon oxide, silicon oxynitride, and/or the like. The first organic layer 162 may include an organic insulating material.

Hereinafter, a method of fabricating a display device 1 according to an exemplary embodiment will be described.

Figure 8:
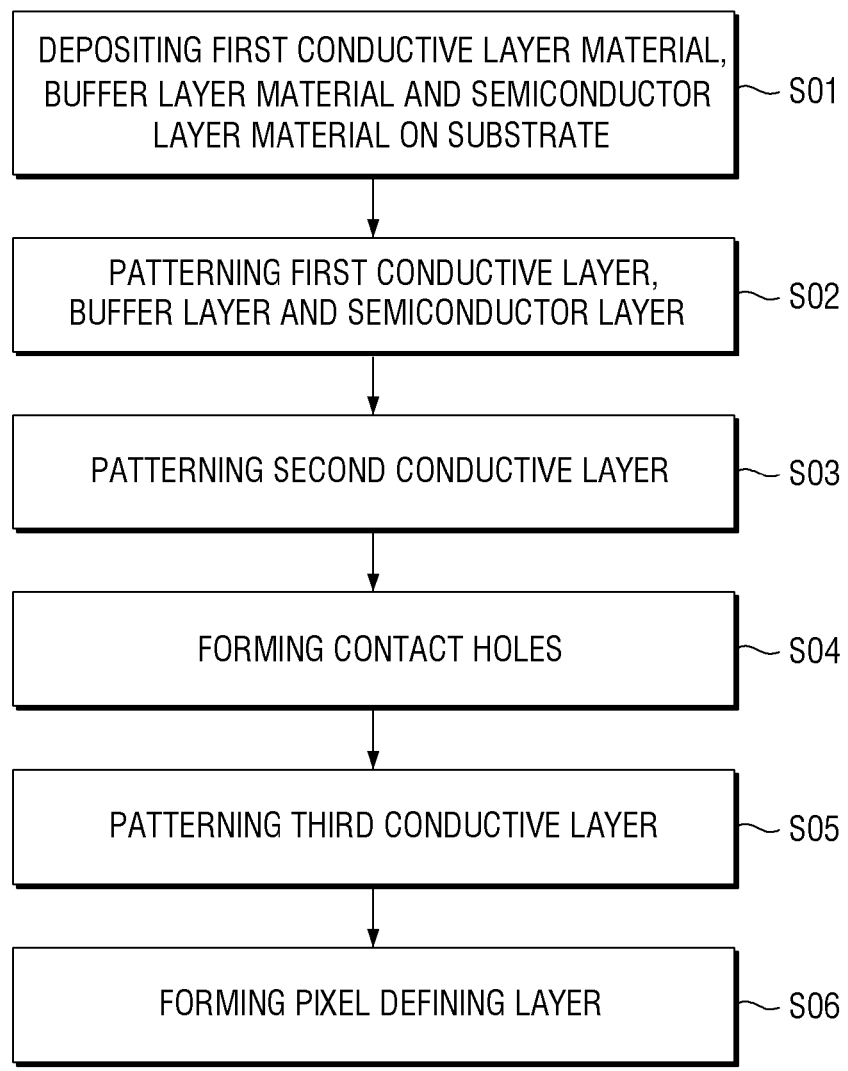
FIG. 8 is a flowchart of a method of fabricating a display device according to an exemplary embodiment.
Figure 9:
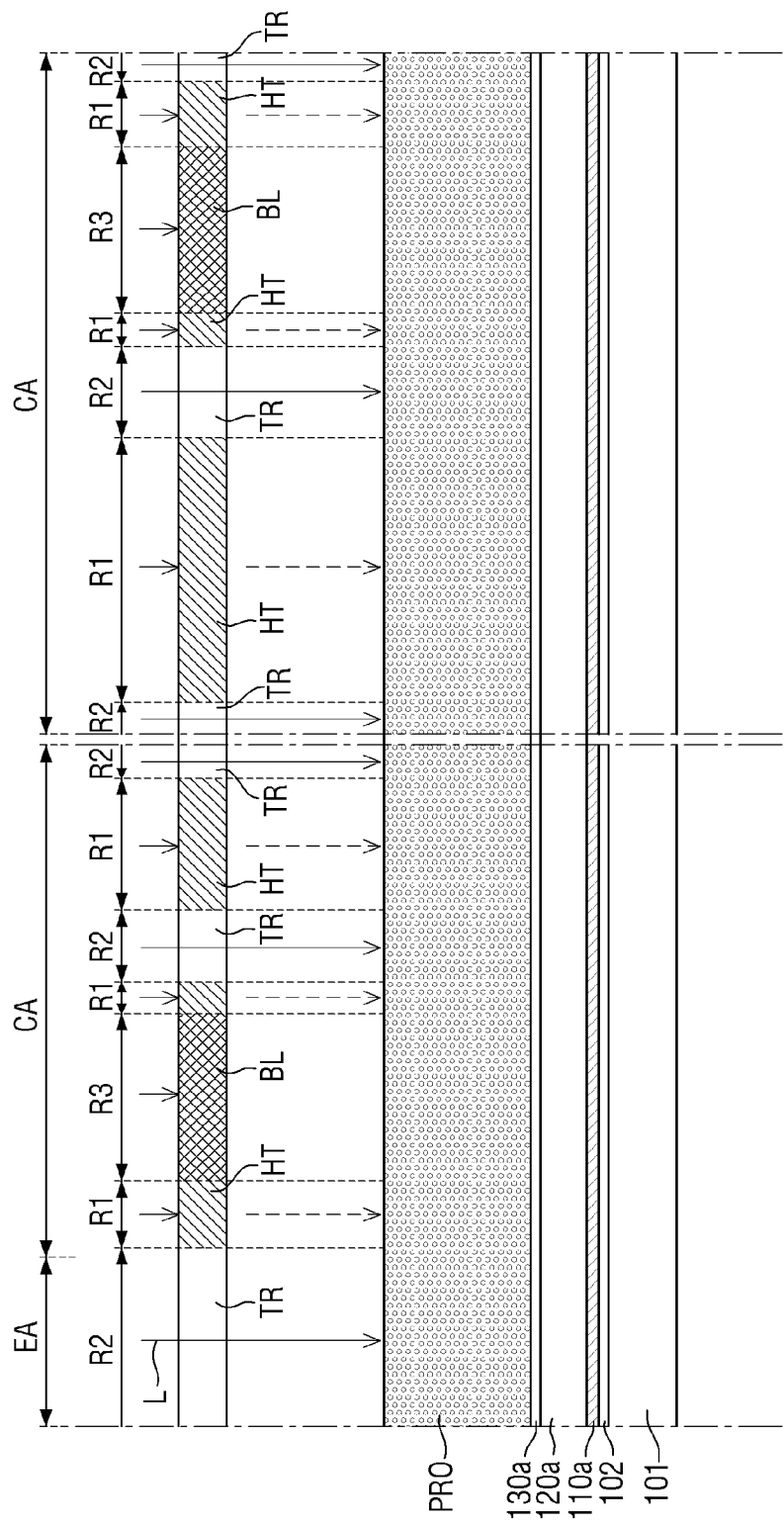
FIGS. 9 to 20 are cross-sectional views showing example active acts of an embodiment of a method of fabricating the display device shown in FIG. 4.
Figure 10:
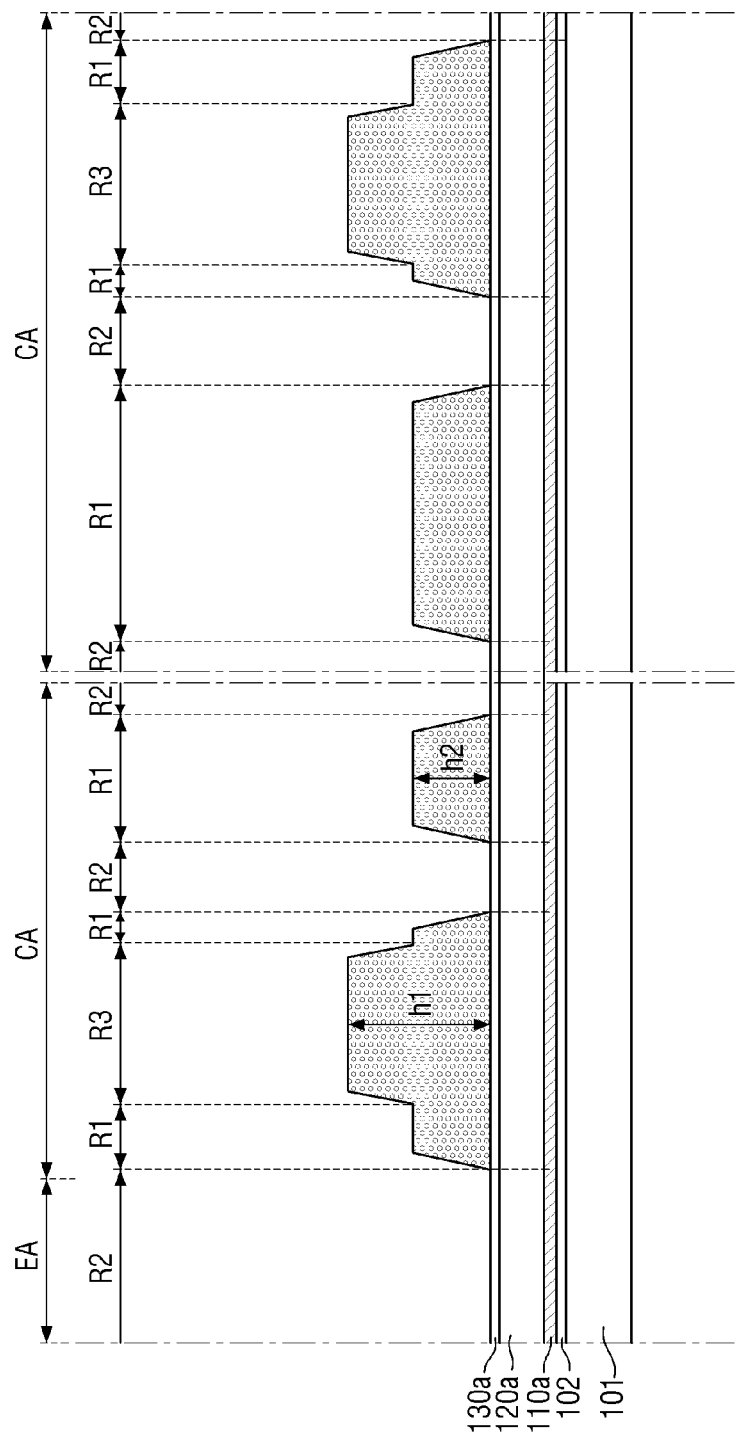
Figure 11:
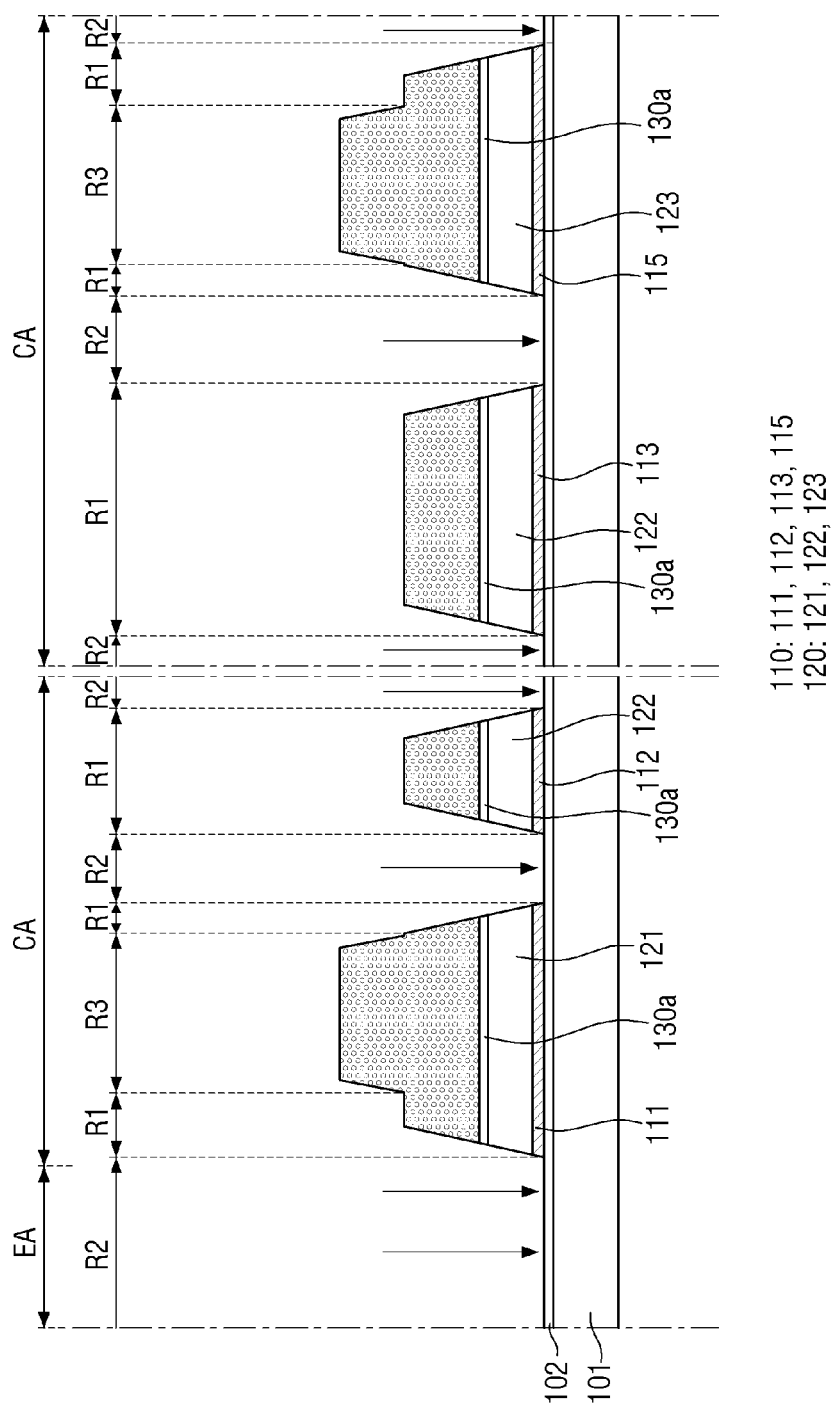
Figure 12:
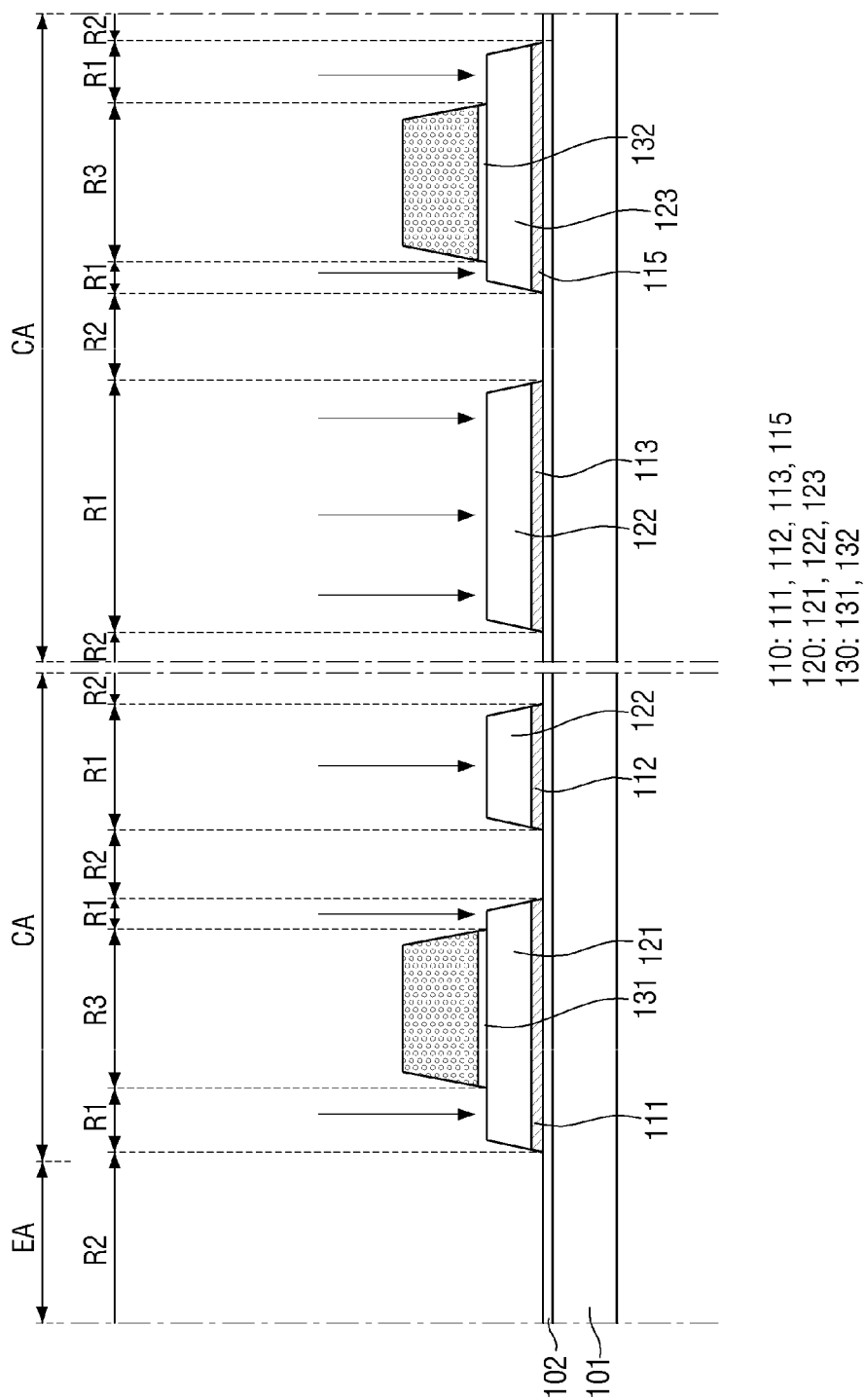
Figure 13:
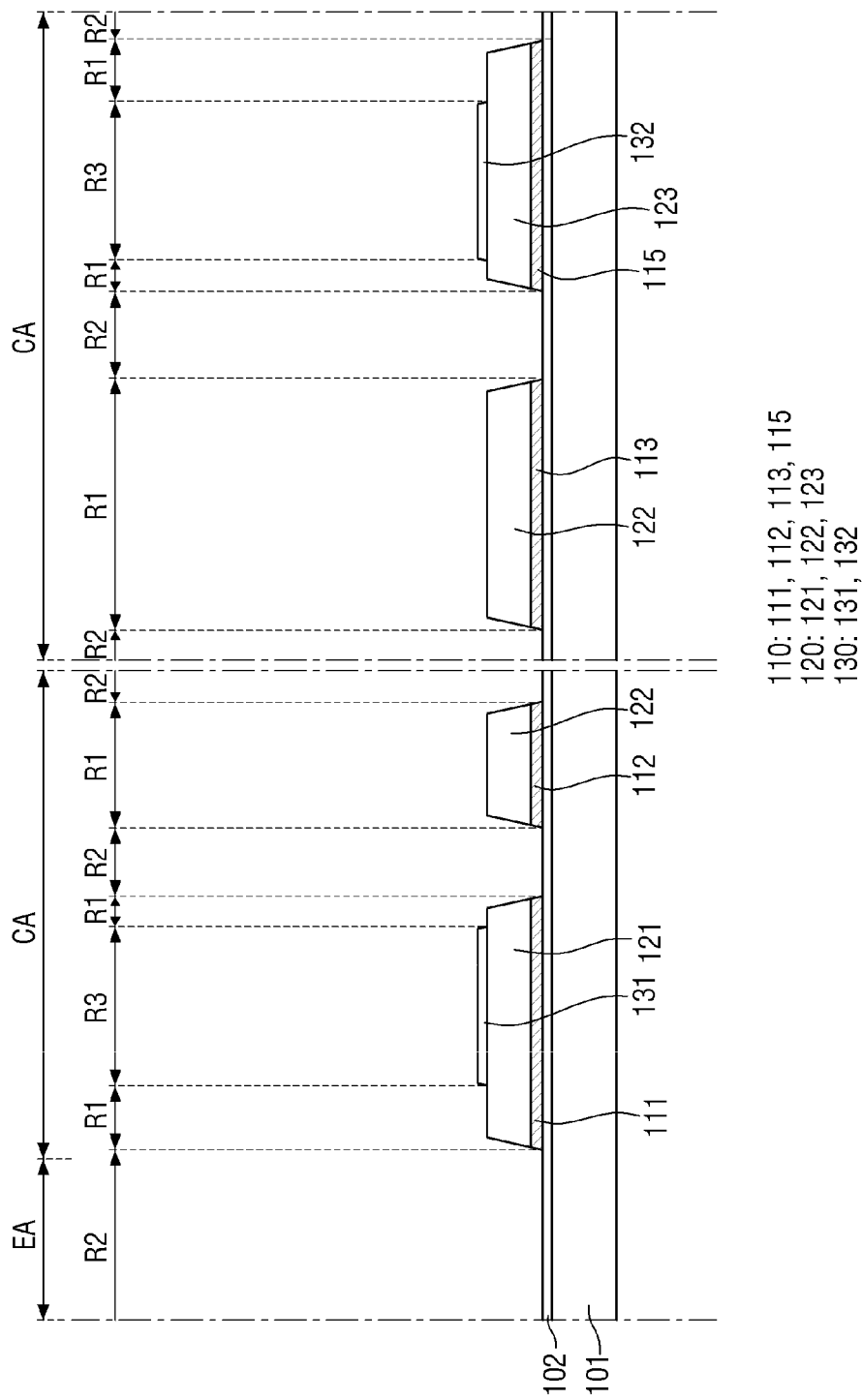
Figure 14:
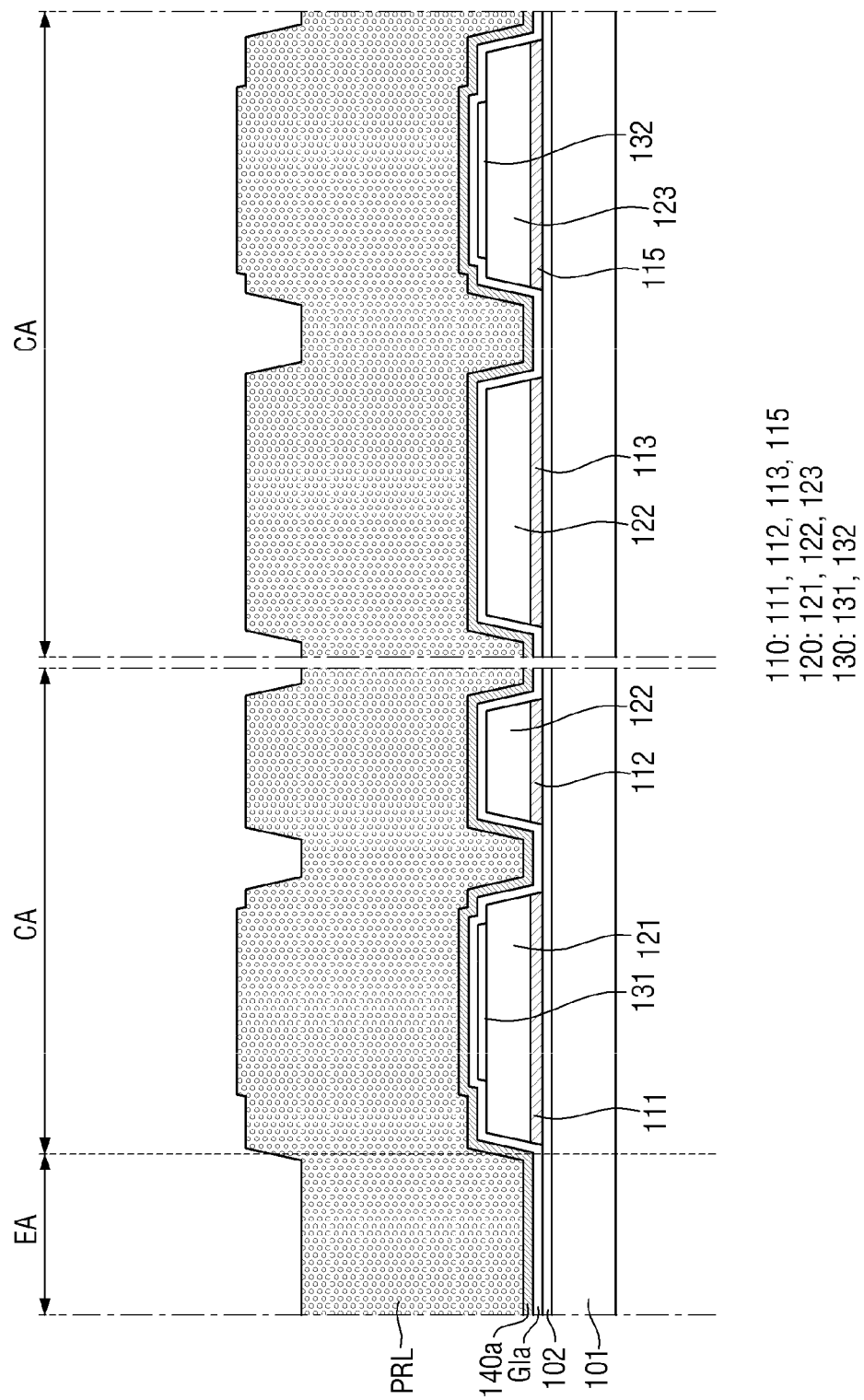
Figure 15:
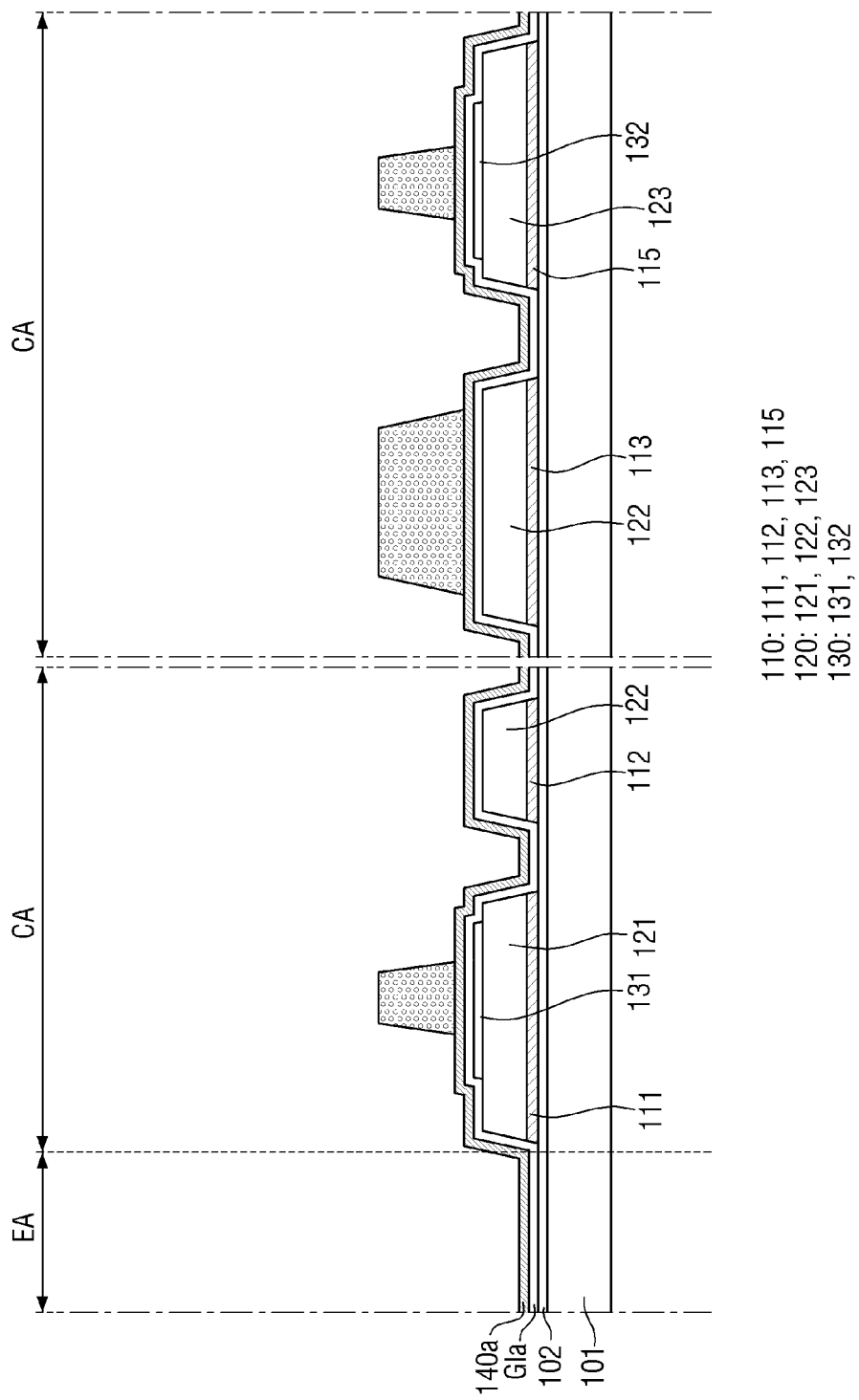
Figure 16:
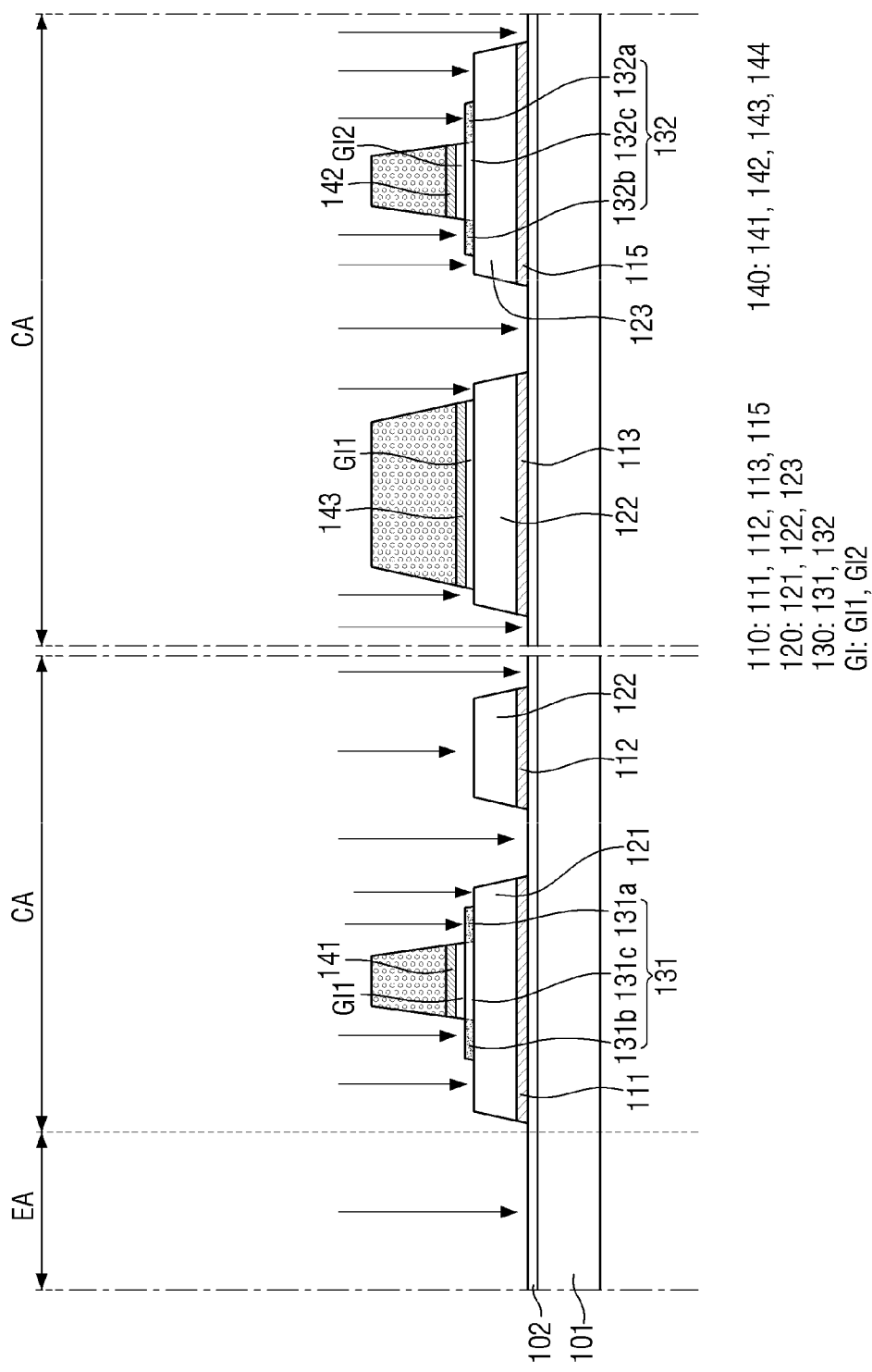
Figure 17:
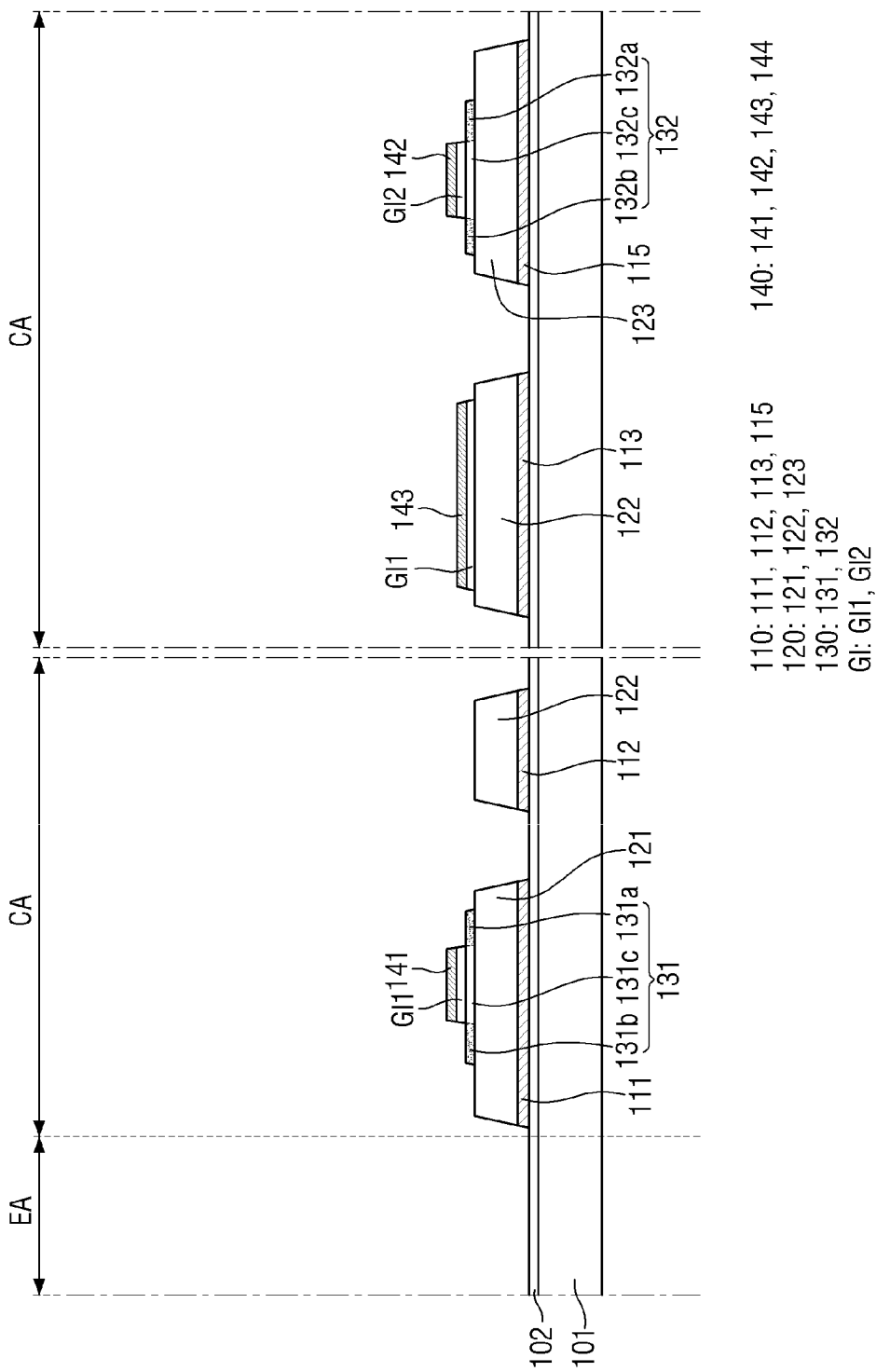

FIG. 8 is a flowchart of a method of fabricating a display device according to an exemplary embodiment. FIGS. 9 to 20 are cross-sectional views showing the active acts of a method of fabricating the display device shown in FIG. 4.

Referring to FIGS. 8 to 13, first, the barrier layer 102 is formed on the entire surface of the base substrate 101, and a first conductive layer material 110a, a buffer layer material 120a and a semiconductor layer material 130a are sequentially deposited on the entire surface of the barrier layer 102 (active act S01). Subsequently, the first conductive layer material 110a, the buffer layer material 120a and the semiconductor layer material 130a are collectively etched to pattern the first conductive layer 110, the buffer layer 120 and the semiconductor layer 130 (active act S02). The active act S02 may be performed using a half-tone mask (HFM), but is not limited thereto. The first conductive layer material 110a, the buffer layer material 120a and the semiconductor layer material 130a may be patterned into the first conductive layer 110, the buffer layer 120 and the semiconductor layer 130, respectively.

In some embodiments, the first conductive layer material 110a, the buffer layer material 120a and the semiconductor layer material 130a are sequentially applied on the entire surface of the barrier layer 102. Then, after applying a photoresist PRO on the semiconductor layer material 130a, exposure is performed using the half-tone mask (HFM).

The half-tone mask HFM may be divided into a light blocking part BL, a first light transmitting part HT and a second light transmitting part TR according to the transmittance (or light transmission ratio) of light L in one mask. The light transmission ratio of the second light transmitting part TR may be greater than the light transmission ratio of the first light transmitting part HT.

The photoresist PRO may be divided into a first region R1, a second region R2 and a third region R3. The first region R1 may correspond to the first light transmitting part HT of the half-tone mask HFM, and the second region R2 may correspond to the second light transmitting part TR of the half-tone mask HFM. Also, the third region R3 may correspond to the light blocking part BL of the half-tone mask HFM.

The light blocking part BL may block the light L provided from the outside to prevent the light L from reaching the third region R3 of the photoresist PRO (or to reduce an amount of the light L that reaches the third region R3 of the photoresist PRO). The first light transmitting part HT may control the transmittance of the light L to transmit only a portion of the light L provided from the outside, and allow only a portion of the light L to reach the first region R1 of the photoresist PRO. The second light transmitting part TR may transmit most of the light L provided from the outside, and allow most of the light L to reach the second region R2 of the photoresist PRO.

For example, in the case of a positive photoresist, a photosensitizer decomposes and an acid is formed in the exposed photoresist. As a result, a region where the photosensitizer decomposes has a property of being well soluble in a developer. In this case, a set or predetermined developer may be used to selectively remove any portion of the photoresist of the substrate according to the chemical change properties of the portion exposed to the light L and the portion not exposed to the light L, thereby forming a photoresist pattern.

However, when the half-tone mask HFM is used, in a portion (e.g., the second region R2) corresponding to a portion (e.g., the first light transmitting part HT) that partially transmits the light L provided from the outside, only a portion of the photoresist may be removed, and the other portion may remain unremoved. Therefore, the photoresist PRO of the third region R3 may remain to a first height h1, and the photoresist PRO of the first region R1 may remain to a second height h2. The first height h1 may be greater than the second height h2. Further, the photoresist of the second region R2 is completely removed, so that a portion of the upper surface of a gate insulating layer material GIa may be exposed in the second region R2. However, in the case of a negative photoresist, whether the photoresist PRO remains in the third region R3 and the first region R1 may be reversed.

Subsequently, the first conductive layer material 110a, the buffer layer material 120a and the semiconductor layer material 130a are collectively etched in the second region R2 where the photoresist PRO is completely removed.

In some embodiments, the first conductive layer material 110a, the buffer layer material 120a, and the semiconductor layer material 130a are collectively etched in the second region R2 where the photoresist PRO is completely removed, thereby forming the buffer layer 120 and the first conductive layer 110. In the process of etching the first conductive layer material 110a, the buffer layer material 120a and the semiconductor layer material 130a, as the first conductive layer material 110a is etched, the first lower light blocking pattern 111, the first power line 112, the first electrode 113 of the capacitor Cst, the data line 114 and the second lower light blocking pattern 115 may be formed. Further, as the buffer layer material 120a is etched, the first buffer pattern 121, the second buffer pattern 122 and the third buffer pattern 123 may be formed.

After the first conductive layer material 110a, the buffer layer material 120a and the semiconductor layer material 130a are collectively etched, an ashing process is performed. Thereafter, the semiconductor layer 130 is patterned.

In some embodiments, through the ashing process, the photoresist PRO of the third region R3 is partially removed such that a certain amount thereof remains, and the photoresist PRO of the first region R1 may be completely removed. Accordingly, the semiconductor layer material 130a of the third region R3 is not exposed, but the semiconductor layer material 130a of the first region R1 may be exposed.

The semiconductor layer material 130a of the exposed first region R1 may be removed through etching, and accordingly, a semiconductor layer including the semiconductor pattern 131 of the first transistor TR1 and the semiconductor pattern 132 of the second transistor TR2 may be formed.

As described above, according to the present embodiment, the semiconductor layer 130, the buffer layer 120 and the first conductive layer 110 may be formed by one mask process. For example, because a separate mask process for forming each of the semiconductor layer 130, the buffer layer 120 and the first conductive layer 110 is unnecessary, the number of mask processes can be reduced, thereby improving process efficiency.

Then, referring to FIGS. 14 to 17, the gate insulating layer GI is formed on the semiconductor layer 130 and the second conductive layer 140 is formed on the gate insulating layer GI (active act S03).

In some embodiments, the patterned gate insulating layer GI and the second conductive layer 140 may be formed by one mask process. The gate insulating layer material GIa is deposited on the entire surface of the barrier layer 102 on which the semiconductor layer 130 is formed, and a second conductive layer material 140a is sequentially deposited on the entire surface of the gate insulating layer material GIa deposited entirely. Subsequently, after applying a photoresist layer PRL on the second conductive layer material 140a, a photoresist pattern is formed through exposure and development. Then, the second conductive layer material 140a and the gate insulating layer material GIa are sequentially etched using the photoresist pattern as an etching mask. Accordingly, the second conductive layer 140 including the gate electrode 141 of the first transistor TR1, the gate electrode 142 of the second transistor TR2, the second electrode 143 of the capacitor Cst and the scan line ("144" in FIG. 4) is patterned. Further, the gate insulating layer GI including the first gate insulating layer region GI1, the second gate insulating layer region GI2 and the third gate insulating layer region GI3 is patterned. The photoresist pattern is then removed through a strip process or an ashing process.

Although not limited thereto, the first and second source/drain regions 131a, 131b, 132a and 132b and the channel regions 131c and 132c of the first and second transistors TR1 and TR2 may be formed through the above process.

In the above description, as an example, the photoresist pattern is used as the etching mask until the gate insulating layer GI is patterned. However, the patterned upper layer may be used as a hard mask for etching the lower layer. In this case, the photoresist pattern may be used as an etching mask together with the hard mask. As another example, after forming the hard mask, the photoresist pattern may be removed, and the lower layer may be etched using the hard mask as an etching mask.

As described above, the second conductive layer material 140a and the gate insulating layer material GIa may cover the entire surfaces of the semiconductor patterns 131 and 132 of the first transistor TR1 and the second transistor TR2. In this case, in a state where the semiconductor patterns 131 and 132 of the first transistor TR1 and the second transistor TR2 are not exposed, the gate electrodes 141 and 142 of the first transistor TR1 and the second transistor TR2 and the gate insulating layers GI1 and GI2 may be formed together. Accordingly, etching out of the first and second source/drain regions 131a, 131b, 132a and 132b of the first transistor TR1 and the second transistor TR2 can be prevented or reduced.

Figure 18:
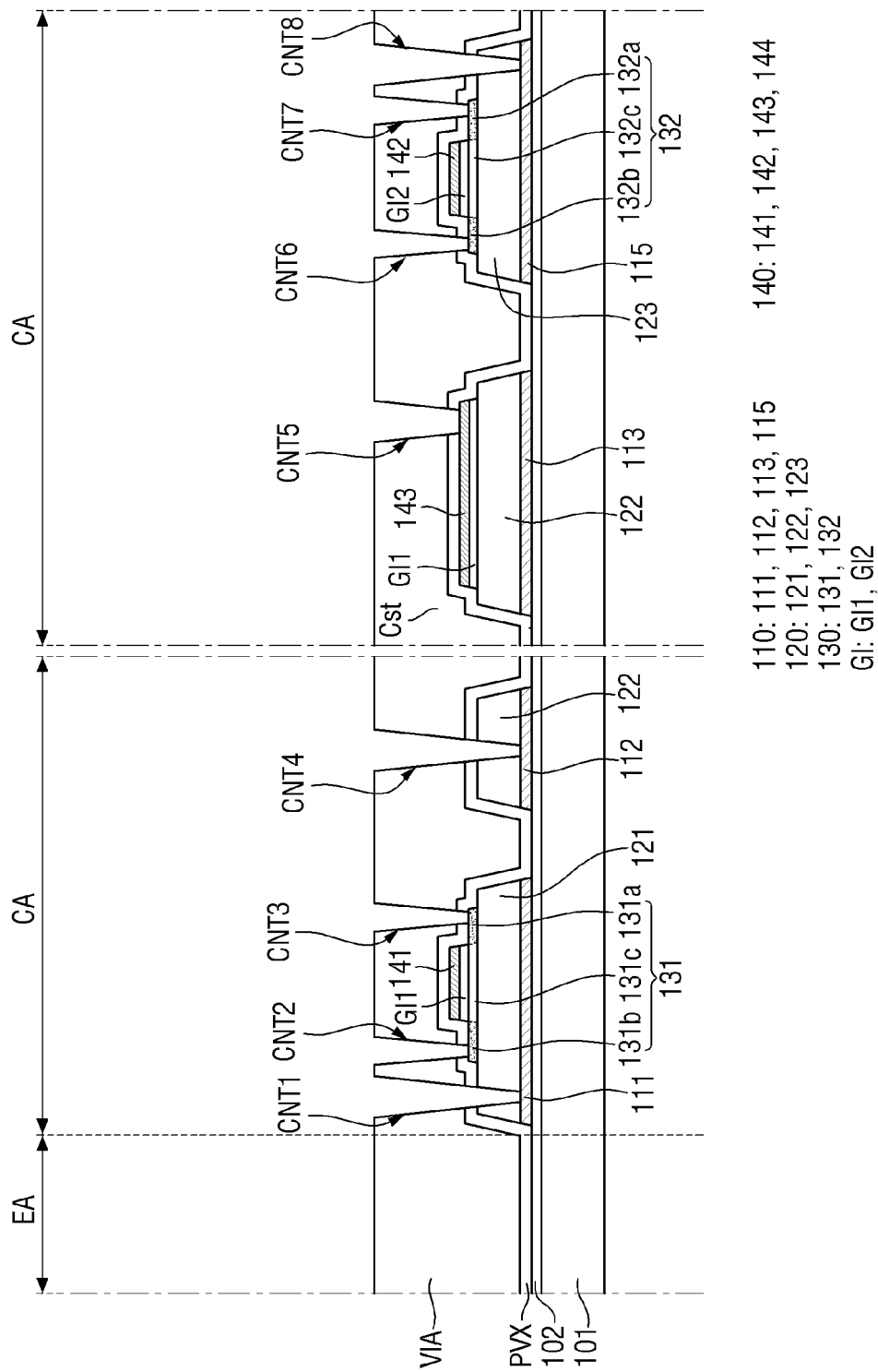

Then, referring to FIG. 18, the passivation layer PVX and the via layer VIA are formed on the second conductive layer 140, and contact holes CNT1 to CNT8 are formed (active act S04).

In some embodiments, the passivation layer PVX is deposited on the top and/or side surface of the gate insulating layer GI, the top and/or side surface of the semiconductor layer 130, the top and/or side surface of the buffer layer 120, the top and/or side surface of the first conductive layer, and the top surface of the barrier layer 102 to cover the second conductive layer 140. After depositing the passivation layer PVX, the via layer VIA is formed by applying a material layer for the via layer on the passivation layer PVX. Thereafter, by etching the via layer VIA and the passivation layer PVX, the contact holes CNT1 to CNT8 exposing the first conductive layer 110, the semiconductor layer 130 and the second conductive layer 120 may be formed to pass through the via layer VIA and the passivation layer PVX.

Figure 19:
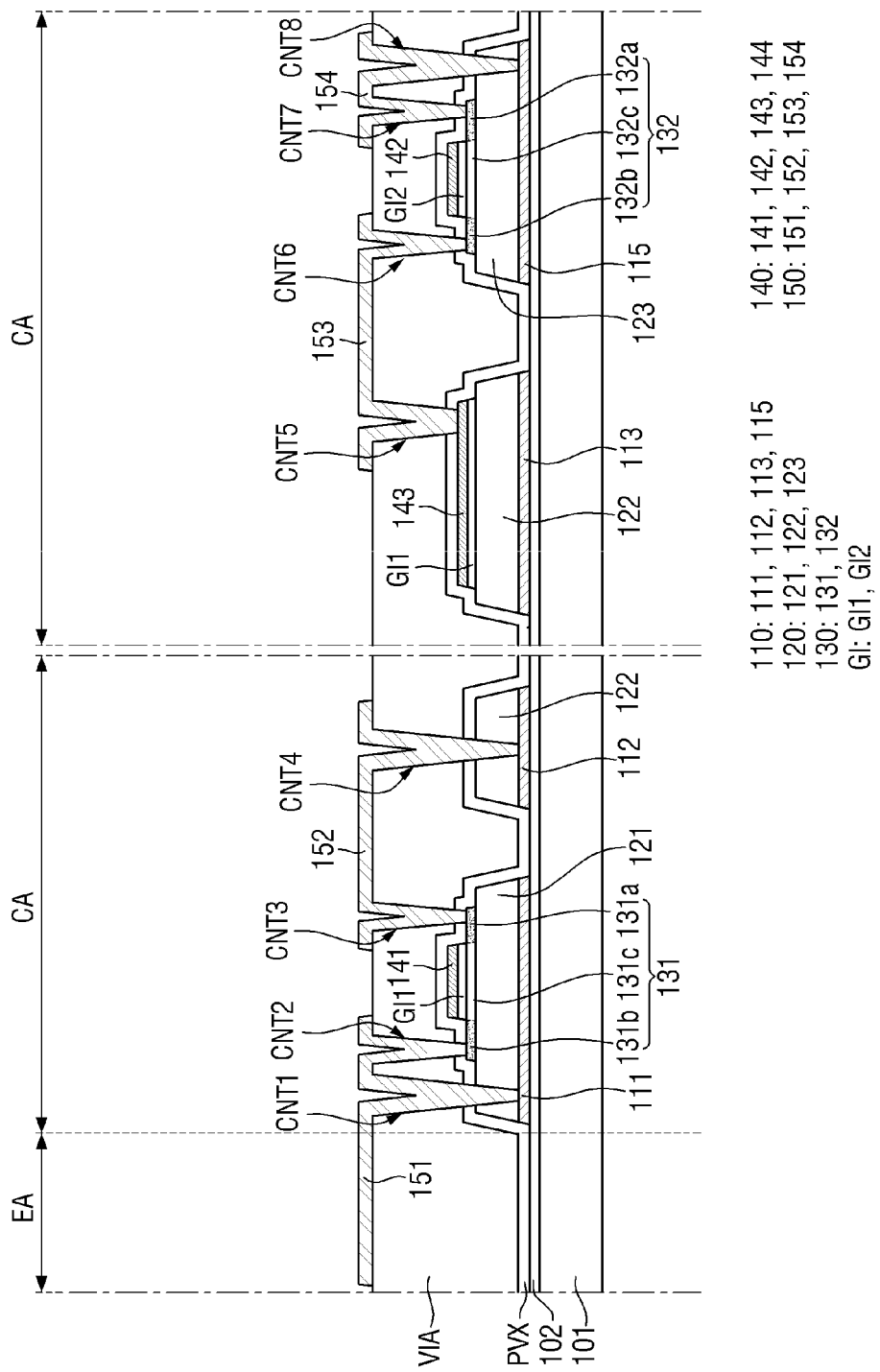

Then, referring to FIG. 19, the third conductive layer 150 is formed on the via layer VIA (active act S05).

The third conductive layer 150 may be formed by a mask process. For example, a material layer for the third conductive layer is entirely deposited on the via layer VIA. In the deposition process, a material layer for the third conductive layer may be deposited to the inside of the contact holes CNT1 to CNT8. Therefore, the third conductive layer 150 may be coupled to the first conductive layer 110, the semiconductor layer 130 and the second conductive layer 120. Subsequently, a photoresist layer is coated on the material layer for the third conductive layer, a photoresist pattern is formed through exposure and development, and then the material layer for the third conductive layer is etched by using the photoresist pattern as an etching mask. Thereafter, the photoresist pattern is removed through a strip or ashing process to complete the patterned third conductive layer 150 as illustrated in FIG. 19.

As described above, as the first source/drain electrodes and the second source/drain electrodes of the first and second transistors TR1 and TR2 are formed using the same mask as the anode electrode of the light emitting element OLED, separate mask processes for forming the first and second source/drain electrodes may be unnecessary. Therefore, the number of mask processes for fabricating the display device 1 can be reduced, and the process efficiency can be increased.

Figure 20:
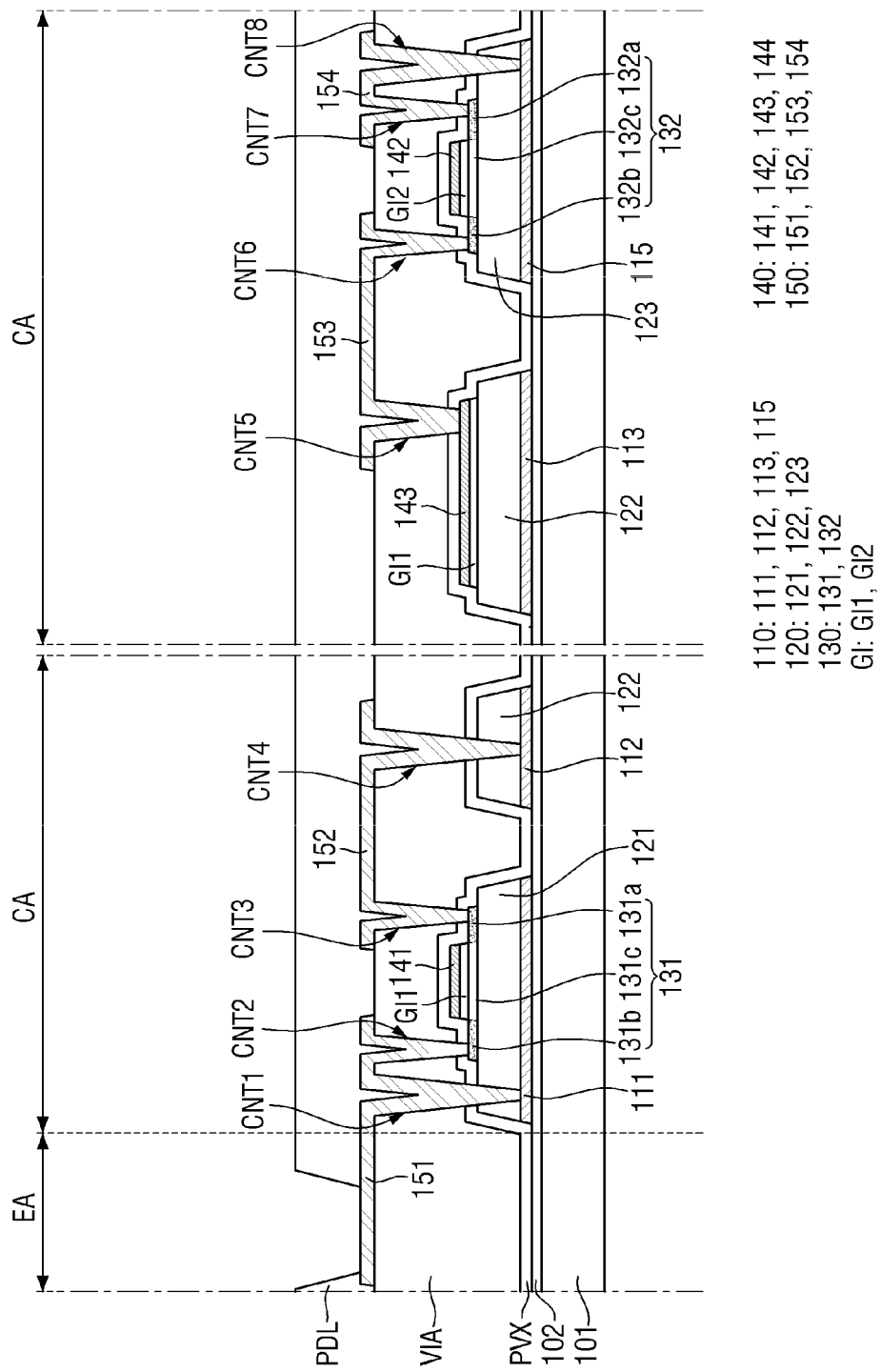

Then, referring to FIG. 20, a patterned pixel defining layer PDL is formed on the via layer VIA to cover the third conductive layer 150 (active act S06).

In some embodiments, the pixel defining layer PDL may include, e.g., an organic material having a photosensitive material. In this case, the patterned pixel defining layer PDL may be formed by applying an organic material layer for the pixel defining layer, followed by exposure and development.

The pixel defining layer PDL may be formed along the boundaries of the pixels PX, and may partially overlap the third conductive layer 150. The pixel defining layer PDL may be formed to overlap the contact holes CNT1 to CNT8. When the third conductive layer 150 fails to completely fill an inner space of the contact holes CNT1 to CNT8 and only partially fills it, the pixel defining layer PDL may completely fill the inner space of the contact holes CNT1 to CNT8.

The light emitting layer EL, the cathode electrode CAT and the thin film encapsulation layer 160 may be further on the pixel defining layer PDL, and a method of fabricating the same should be readily understood by those of ordinary skill in the art, and thus, further description thereof is not necessary here.

Hereinafter, embodiments of the present disclosure will be further described. In the following embodiments, a description of the same components as those of the above-described embodiment will be omitted or simplified to avoid redundancy, and differences will mainly be described for clarity.

Figure 21:
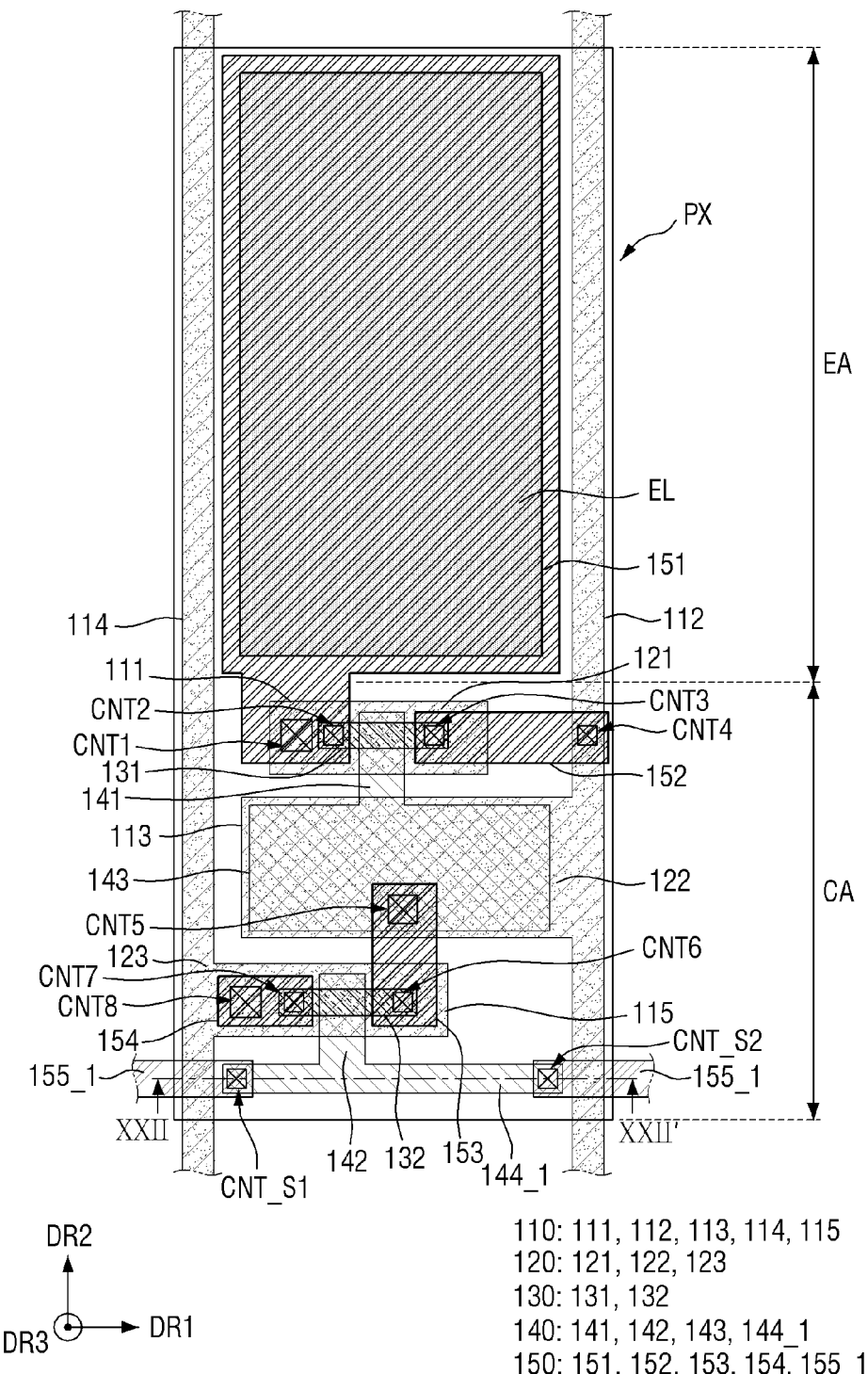
FIG. 21 is a layout diagram of one pixel of a display device according to another embodiment.
Figure 22:
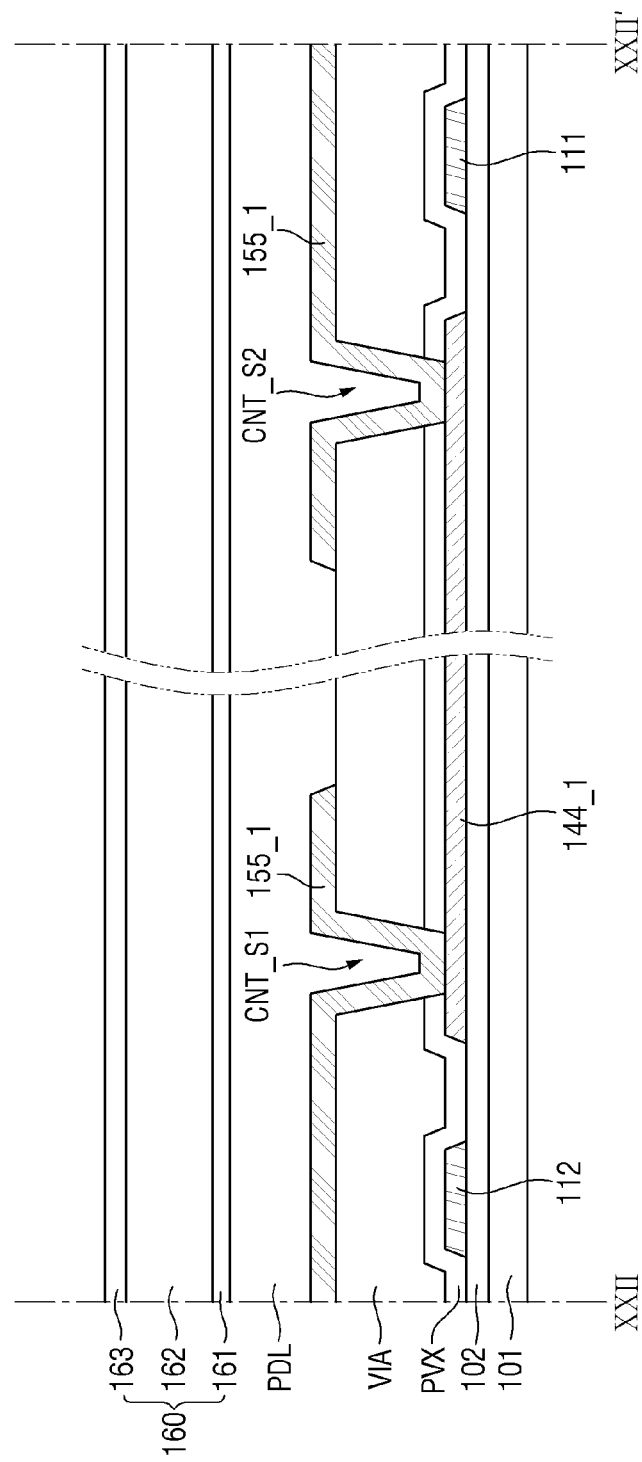
FIG. 22 is a cross-sectional view taken along line XXII-XXII' of FIG. 21.

FIG. 21 is a layout diagram of one pixel of a display device according to another embodiment. FIG. 22 is a cross-sectional view taken along line XXII-XXII' of FIG. 21.

Referring to FIGS. 21 and 22, the present embodiment has a difference from the embodiment of FIG. 4 in that a second conductive layer 140 of a display panel 10_1 included in a display device according to the present embodiment has a shape different from that of a gate insulating layer GI in a plan view.

In some embodiments, a first gate insulating layer region GI1 and a gate electrode 141 of a first transistor TR1 overlap each other, and a second gate insulating layer region GI2 and a gate electrode 142 of a second transistor TR2 overlap each other, but a third gate insulating layer region GI3 is not below a scan line 144_1.

In this case, a third conductive layer 150 may further include a connection wiring 155_1. The scan line 144_1 may be electrically coupled to a scan line 144_1, a first power line 112 and a data line 114 by a coupling wiring 155_1 and contact holes CNT_S1 and CNT_S2 on a different layer without being directly coupled to the scan line 144_1 of a neighboring pixel PX_1. The scan line 144_1 does not extend to another pixel PX_1 located adjacent thereto in the first direction DR1, but may be located only in one pixel PX_1.

The connection wiring 155_1 may be formed on the via layer VIA, and may be electrically coupled to the scan line 144_1 of one pixel PX_1 through the contact holes CNT_S1 and CNT_S2 passing through the via layer VIA and the passivation layer PVX to expose the scan line 144_1. In this case, one connection wiring 155_1 may be electrically coupled to not only the scan line 144_1 of one pixel PX_1, but also the scan line 144_1 of the pixel PX_1 adjacent to the one pixel PX_1 in the first direction DR1. Accordingly, even if the scan line 144_1 is only in one pixel PX_1, it may be electrically coupled to the scan line 144_1 of the neighboring pixel PX_1 by the connection wiring 155_1.

The connection wiring 155_1 may cross or intersect the first power line 112 and the data line 114. The passivation layer PVX and the via layer VIA are between the connection wiring 155_1 and the first power line 112 and the data line 114 to insulate the connection wiring 155_1 from the first power line 112 and the data line 114. For example, even if a separate insulating layer is not located below the scan line 144_1, the scan line 144_1 of one pixel PX_1 may be electrically coupled to the scan line 144_1 of the neighboring pixel PX_1 by the connection wiring 155_1 without or substantially without short (or short circuit) with the first power line 112 and the data line 114.

The connection wiring 155_1 may be formed together with the third conductive layer 150 using the same mask, and the contact holes CNT_S1 and CNT_S2 electrically coupling the connection wiring 155_1 to the scan line 144_1 may be formed together with the remaining contact holes CNT1 to CNT8 using the same mask. Therefore, a separate mask for forming the connection wiring 155_1 or the contact holes CNT_S1 and CNT_S2 is unnecessary.

In some embodiments, in the active act S01 of sequentially depositing the first conductive layer material 110a, the buffer layer material 120a and the semiconductor layer material 130a, the gate insulating layer GI may be deposited together with the above-described materials 110a, 120a and 130a. Thereafter, in the active act S02 of patterning the first conductive layer material 110a, the buffer layer material 120a and the semiconductor layer material 130a, the gate insulating layer GI may be patterned together. Accordingly, an insulating layer (e.g., the gate insulating layer GI) may not be below the scan line 144_1.

Also in this case, because a separate mask process for forming the first and second source/drain electrodes and a separate mask process for forming the first conductive layer 110 are unnecessary, the number of mask processes for fabricating the display device can be reduced, and the process efficiency can be increased. In addition, because the scan line 144_1, the first power line 112 and the data line 114 do not overlap in the thickness direction, even if a separate insulating layer is not below the scan line 144_1, the scan line 144_1 is not electrically coupled to the first power line 112 and the data line 114.

Figure 23:
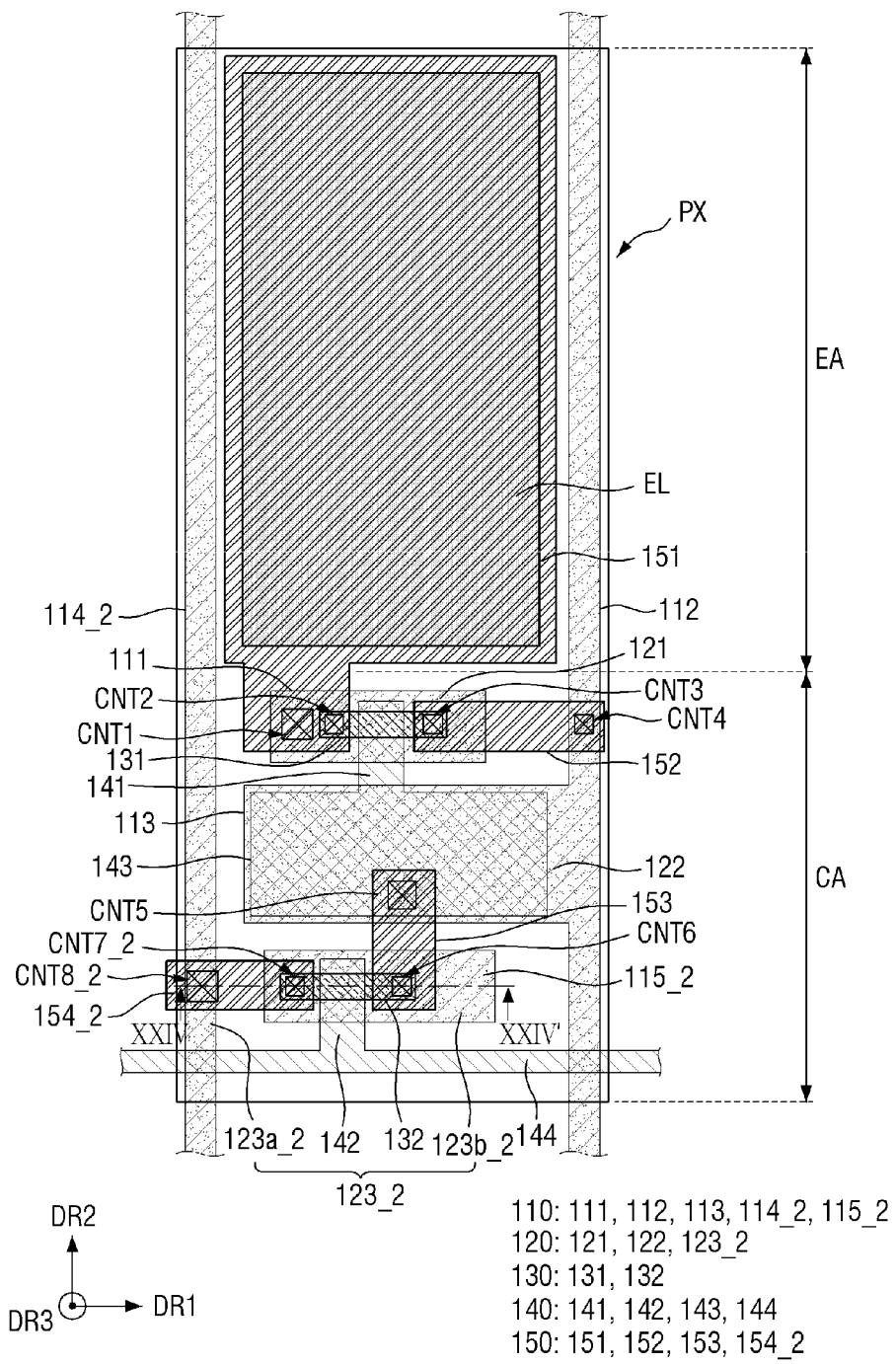
FIG. 23 is a layout diagram of one pixel of a display device according to still another embodiment.
Figure 24:
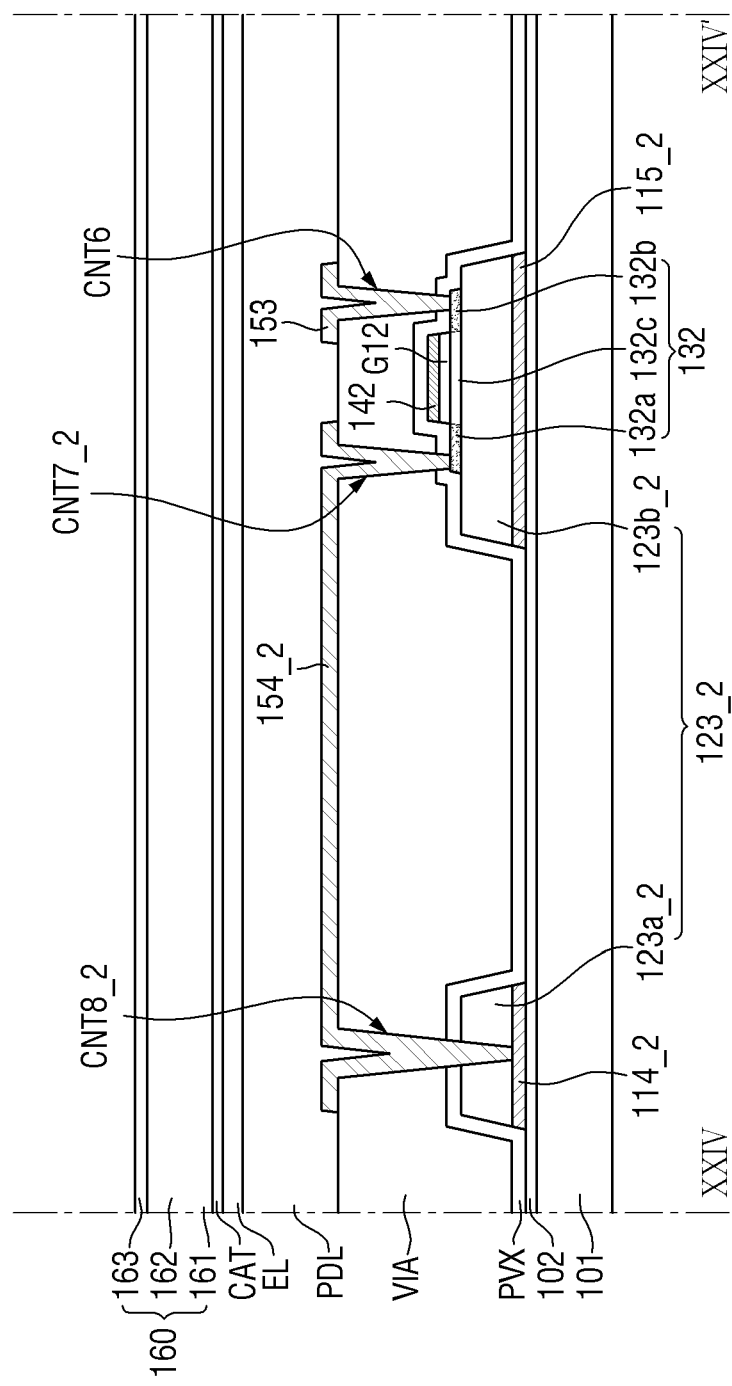
FIG. 24 is a cross-sectional view taken along line XXIV-XXIV' of FIG. 23.

FIG. 23 is a layout diagram of one pixel of a display device according to still another embodiment. FIG. 24 is a cross-sectional view taken along line XXIV-XXIV' of FIG. 23.

Referring to FIGS. 23 and 24, the present embodiment is different from the embodiment of FIG. 4 in that a data line 114_2 and a second lower light blocking pattern 115_2 are not formed integrally and are spaced apart from each other.

In some embodiments, the second lower light blocking pattern 115_2 may be spaced apart from a data line 114_3 and may overlap at least a channel region 132c of a second transistor TR2 in the thickness direction.

A third buffer pattern 123_2 having the same (e.g., substantially the same) shape as the data line 114_2 and the second lower light blocking pattern 115_2 in a plan view and overlapping the data line 114_2 and the second lower light blocking pattern 115_2 may include a first region 123a_2 and a second region 123b_2, and the first region 123a_2 and the second region 123b_2 may be spaced apart from each other. The first region 123a_2 of the third buffer pattern 123_2 may have the same (e.g., substantially the same) shape as the data line 114_2, and may overlap the data line 114_2. The second region 123b_2 of the third buffer pattern 123_2 may have the same (e.g., substantially the same) shape as the second lower light blocking pattern 115_2 and may overlap the second lower light blocking pattern 115_2.

A fourth conductive pattern 154_2 may overlap at least a portion of the data line 114_2, at least a portion of the semiconductor pattern 132 of the second transistor TR2, and at least a portion of the second lower light blocking pattern 115_2. The fourth conductive pattern 154_2 may pass through the via layer VIA and the passivation layer PVX in the overlapping region, and may contact (e.g., physically contact) the first source/drain region 131b of the second transistor TR2 through a contact hole CNT7_2 exposing a portion of the first source/drain region 131b of the second transistor TR2. Further, the fourth conductive pattern 154_2 may pass through the via layer VIA, the passivation layer PVX and the buffer layer 120 in the overlapping region, and may contact (e.g., physically contact) the data line 114_2 through a contact hole CNT8_2 exposing a portion of the second lower light blocking pattern 115. Thus, the first source/drain region 131b of the second transistor TR2 and the data line 114_2 may be electrically coupled to each other by the fourth conductive pattern 154_2. In this case, a voltage may not be applied to the second lower light blocking pattern 115_2. However, the present disclosure is not limited thereto, and through a separate contact hole in the overlapping region, the fourth conductive pattern 154_2 may contact (e.g., physically contact) the second lower light blocking pattern 115_2, and accordingly, the fourth conductive pattern 154_2 may be electrically coupled to the data line 114_2.

Also in this case, because a separate mask process for forming the first and second source/drain electrodes and a separate mask process for forming the first conductive layer 110 are unnecessary, the number of mask processes for fabricating the display device can be reduced, and the process efficiency can be increased.

Figure 25:
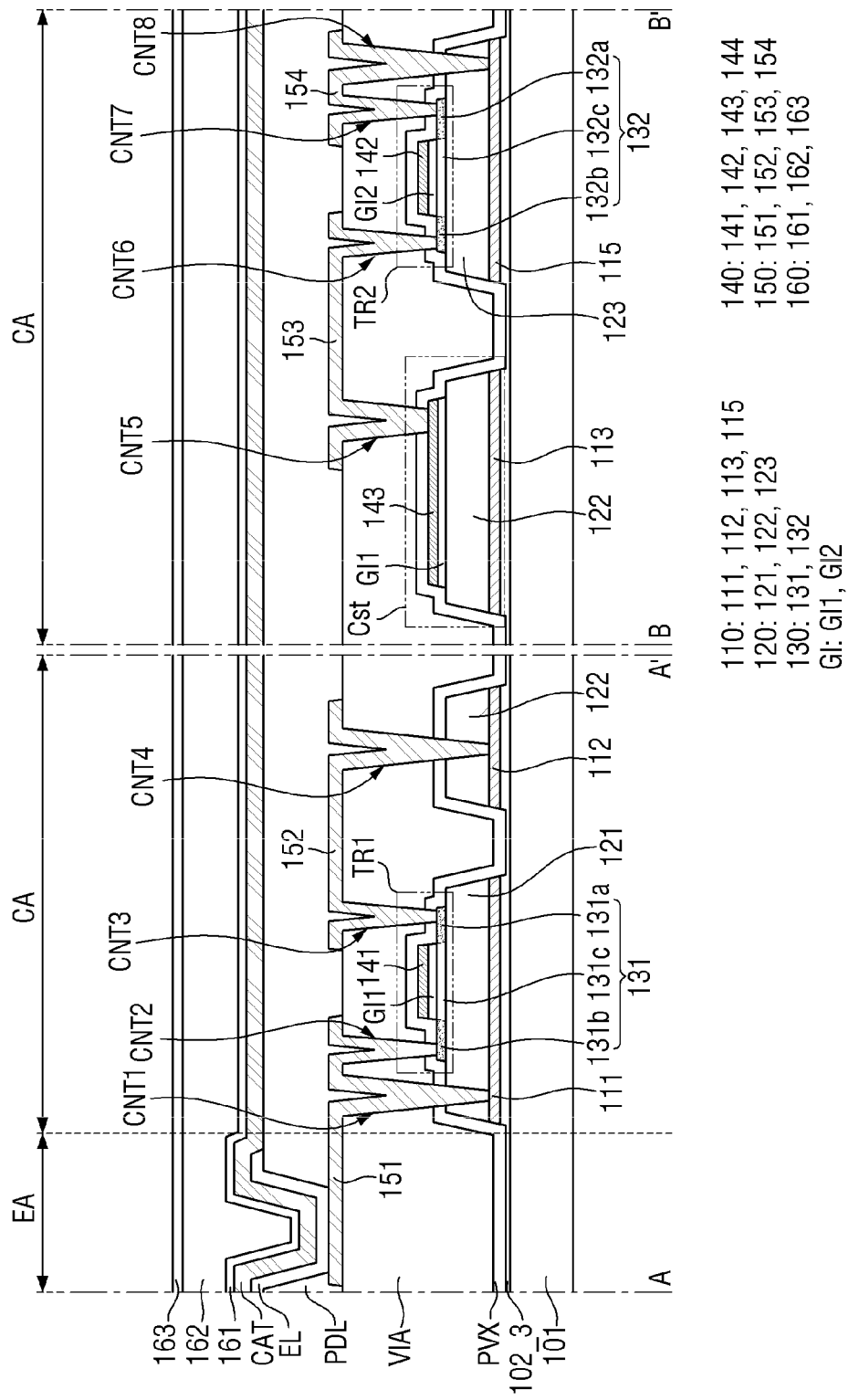
FIG. 25 is a cross-sectional view of a display panel of a display device according to still another embodiment.

FIG. 25 is a cross-sectional view of a display panel of a display device according to still another embodiment.

Referring to FIG. 25, the present embodiment is different from the embodiment of FIG. 7 in that a portion of the upper surface of a barrier layer 102_3 on a display panel 10_3 is etched.

In some embodiments, in an etching process for patterning the first conductive layer 110, the buffer layer 120 and the semiconductor layer 130, the first conductive layer material 110a (see FIGS. 9 to 13), the buffer layer material 120a (see FIGS. 9 to 13) and the semiconductor layer material 130a (see FIGS. 9 to 13) are etched, and after the first conductive layer 110 and the buffer layer 120 are patterned, the exposed barrier layer 102_3 may be further etched. In this case, the side surface of the first conductive layer 110 and the side surface of the buffer layer 120 may be aligned, and the inner wall of a partial region of the etched barrier layer 102_3 may also be aligned. Further, the thickness of the barrier layer 102_3 in the region overlapping the first conductive layer 110 and the buffer layer 120 may be greater than the thickness of the barrier layer 102_3 in the remaining regions.

Also in this case, because a separate mask process for forming the first and second source/drain electrodes and a separate mask process for forming the first conductive layer 110 are unnecessary, the number of mask processes for fabricating the display device can be reduced, and the process efficiency can be increased.

In concluding the detailed description, those skilled in the art will appreciate that many variations and modifications can be made to the disclosed embodiments without substantially departing from the spirit and scope of the present disclosure. Therefore, the disclosed embodiments of the present disclosure are used in a generic and descriptive sense only and not for purposes of limitation.

What is claimed is:

1. A display device comprising:
   a substrate;
   a first conductive layer on the substrate and including a lower light blocking pattern;
   a buffer layer on the first conductive layer;
   a semiconductor pattern on the buffer layer;
   a gate insulating layer on the semiconductor pattern;
   a gate electrode on the gate insulating layer;
   a passivation layer on the gate electrode;
   a planarization layer on the passivation layer; and
   a second conductive layer on the planarization layer, and including a first conductive pattern electrically coupling the lower light blocking pattern to the semiconductor pattern,
   wherein the first conductive pattern is coupled to the lower light blocking pattern through a first contact hole passing through the planarization layer and the buffer layer, and coupled to the semiconductor pattern through a second contact hole passing through the planarization layer,
   wherein the second conductive layer further includes a second conductive pattern spaced apart from the first conductive pattern, and the second conductive pattern electrically couples the semiconductor pattern to a signal line,
   wherein the first contact hole and the second contact hole pass through the passivation layer, and the passivation layer covers at least a portion of a top surface of the substrate while covering a top surface of the gate electrode.

2. The display device of claim 1, wherein the first conductive layer and the buffer layer have the same shape in a plan view.

3. The display device of claim 2, wherein a side surface of the first conductive layer and a side surface of the buffer layer are aligned with each other.

4. The display device of claim 1, wherein the lower light blocking pattern overlaps an entire region of the semiconductor pattern.

5. The display device of claim 1, wherein the second conductive layer further includes a pixel electrode integrally formed with the first conductive pattern.

6. The display device of claim 5, further comprising:
   a light emitting layer on the pixel electrode and a common electrode on the light emitting layer.

7. The display device of claim 5, further comprising:
   a pixel defining layer covering at least a portion of the first conductive pattern,
   wherein the pixel defining layer exposes a portion of the first conductive pattern.

8. The display device of claim 1, wherein the signal line is a data line or a first power line.

9. The display device of claim 1, further comprising:
   a pixel defining layer on the second conductive layer to cover the second conductive pattern.

10. The display device of claim 1, wherein the passivation layer covers at least a portion of a side surface of the buffer layer and at least a portion of a side surface of the first conductive layer.

11. The display device of claim 10, wherein the planarization layer is on the passivation layer, and is on the side surface of the buffer layer and/or the side surface of the first conductive layer.

12. A display device comprising:
    a substrate;
    a first conductive layer on the substrate and including a signal line;
    a buffer layer on the first conductive layer;
    a semiconductor pattern on the buffer layer;
    a gate insulating layer on the semiconductor pattern;
    a gate electrode on the gate insulating layer;
    a passivation layer on the gate electrode;
    a planarization layer on the passivation layer; and
    a second conductive layer on the planarization layer and including a conductive pattern electrically coupling the semiconductor pattern to the signal line,
    wherein the conductive pattern is coupled to the signal line through a first contact hole passing through the planarization layer and the buffer layer, and coupled to the semiconductor pattern through a second contact hole passing through the planarization layer,
    wherein the second conductive layer further includes a second conductive pattern spaced apart from the first conductive pattern, and the second conductive pattern electrically couples the semiconductor pattern to a lower light blocking pattern,
    wherein the first contact hole and the second contact hole pass through the passivation layer, and the passivation layer covers at least a portion of a top surface of the substrate while covering a top surface of the gate electrode.

13. The display device of claim 12, wherein the signal line is a first power line or a data line.

14. The display device of claim 12, wherein the buffer layer has the same shape as the first conductive layer in a plan view.

15. A method of fabricating a display device, the method comprising:

depositing a first conductive layer material, a buffer layer material and a semiconductor layer material entirely on a substrate;

etching the first conductive layer material, the buffer layer material and the semiconductor layer material using a mask having a light blocking part and two or more light transmitting parts having different light transmittances to pattern a first conductive layer including a lower light blocking pattern, a buffer layer and a semiconductor layer;

forming a gate insulating layer on the semiconductor layer;

forming a second conductive layer including a gate electrode on the gate insulating layer;

forming a planarization layer on the second conductive layer; and forming a third conductive layer on the planarization layer, the third conductive layer including a first conductive pattern electrically coupling the lower light blocking pattern to the semiconductor layer, wherein the first conductive pattern is coupled to the lower light blocking pattern through a first contact hole passing through the planarization layer and the buffer layer, and coupled to the semiconductor layer through a second contact hole passing through the planarization layer, wherein the first conductive layer further includes a signal line, and the third conductive layer is spaced apart from the first conductive layer, and further includes a second conductive pattern electrically coupling the semiconductor layer to the signal line, and wherein the second conductive pattern is coupled to the signal line through a third contact hole passing through the planarization layer and the buffer layer, and coupled to the semiconductor layer through a fourth contact hole passing through the planarization layer.

16. The method of claim 15, wherein the first conductive layer and the buffer layer have the same shape in a plan view.

17. The method of claim 15, wherein the signal line is a first power line or a data line.

* * * * *